(12) United States Patent
Chan et al.

(10) Patent No.: US 11,670,595 B2
(45) Date of Patent: Jun. 6, 2023

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Yu-Chen Chan, Taichung (TW); Shu-Wei Li, Hsinchu (TW); Shin-Yi Yang, New Taipei (TW); Ming-Han Lee, Taipei (TW); Shau-Lin Shue, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 116 days.

(21) Appl. No.: 17/184,942

(22) Filed: Feb. 25, 2021

(65) Prior Publication Data
US 2022/0270970 A1   Aug. 25, 2022

(51) Int. Cl.
*H01L 23/535* (2006.01)
*H01L 23/532* (2006.01)

(52) U.S. Cl.
CPC ...... *H01L 23/535* (2013.01); *H01L 23/53276* (2013.01)

(58) Field of Classification Search
CPC .................. H01L 23/535; H01L 23/53276
See application file for complete search history.

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 2019/0096801 A1* | 3/2019 | Yang | H01L 21/76885 |
| 2021/0305378 A1* | 9/2021 | Seol | H01L 29/78696 |
| 2021/0375722 A1* | 12/2021 | Kim | H01L 29/0665 |

* cited by examiner

*Primary Examiner* — Farun Lu
(74) *Attorney, Agent, or Firm* — Nz Carr Law Office

(57) ABSTRACT

An interconnection structure, along with methods of forming such, are described. The structure includes a first conductive feature having a two-dimensional material layer, a second conductive feature disposed over the first conductive feature, and a dielectric material disposed adjacent the first and second conductive features. The dielectric material extends from a level of a bottom of the first conductive feature to a level of a top of the second conductive feature.

20 Claims, 18 Drawing Sheets

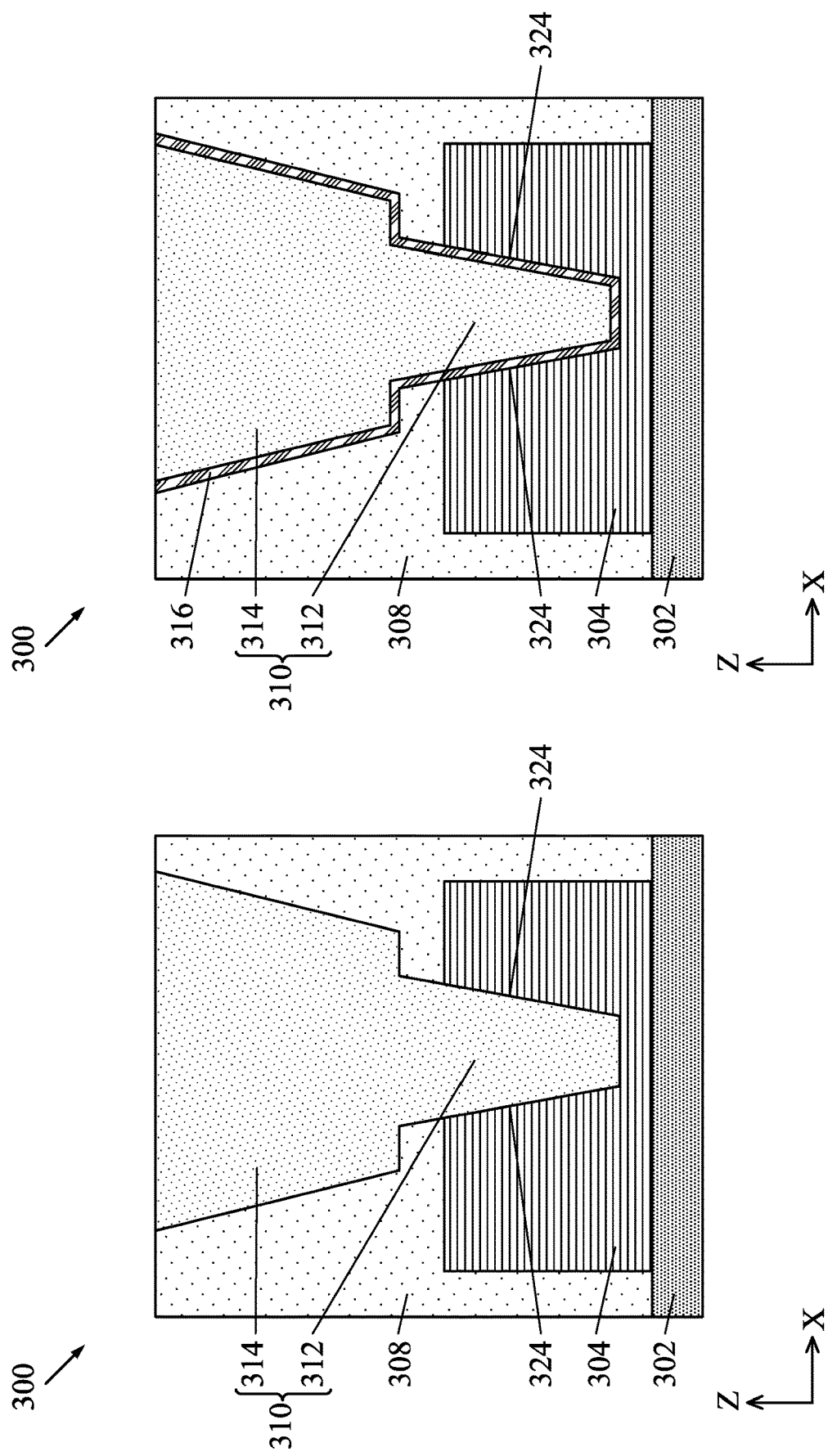

SEMICONDUCTOR DEVICE STRUCTURE AND METHODS OF FORMING THE SAME

BACKGROUND

As the semiconductor industry introduces new generations of integrated circuits (IC) having higher performance and more functionality, the density of the elements forming the ICs increases, while the dimensions, sizes and spacing between components or elements are reduced. In the past, such reductions were limited only by the ability to define the structures photo-lithographically, device geometries having smaller dimensions created new limiting factors. For example, with the dimensions of the metallic conductive features in back-end-of-line (BEOL) interconnect getting smaller, sheet resistance and contact resistance increase. Therefore, improved conductive features are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3D are cross-sectional side views of various stages of manufacturing the interconnection structure, in accordance with alternative embodiments.

DETAILED DESCRIPTION

Figure 1:
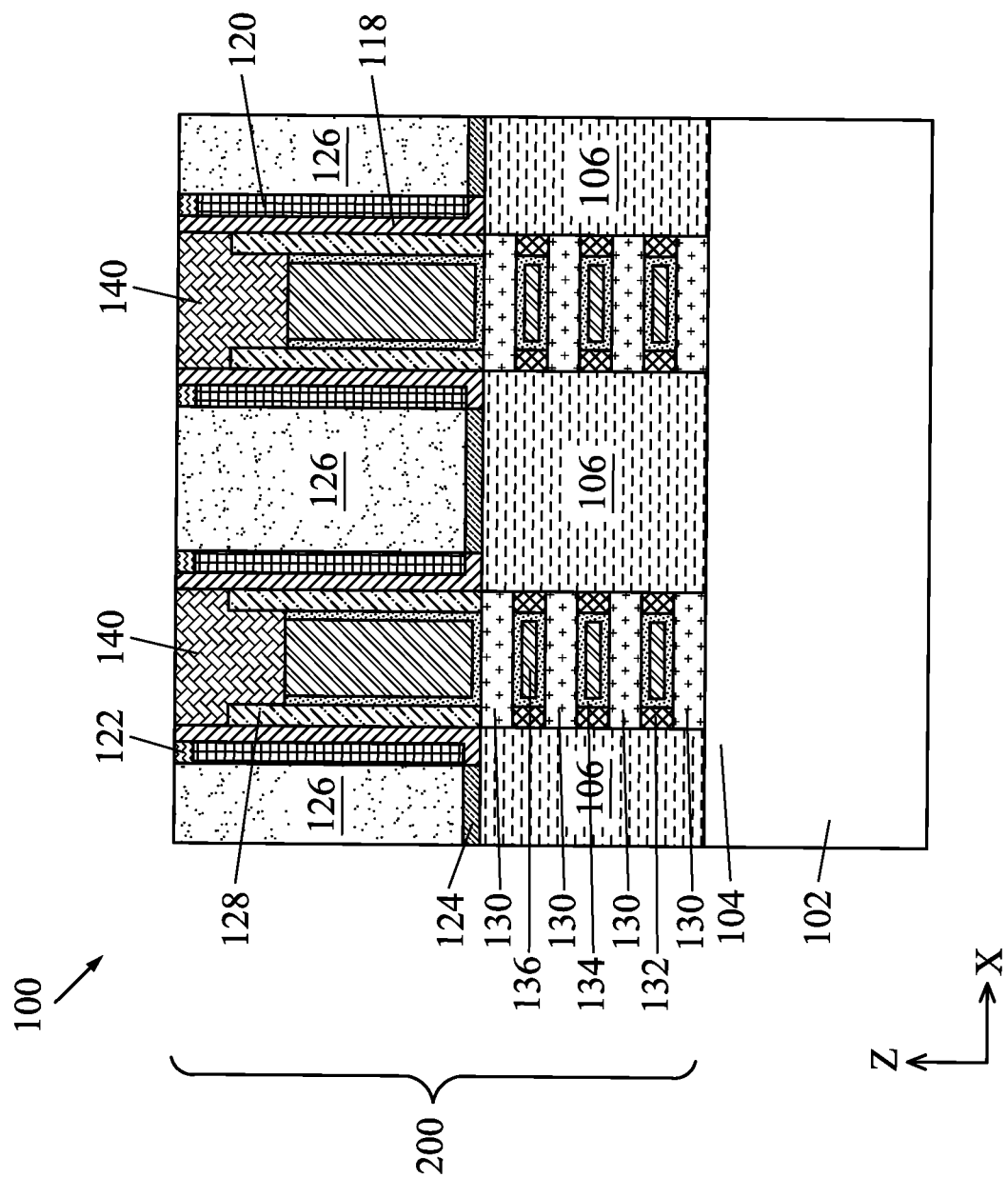
FIG. 1 is a cross-sectional side view of the stage of manufacturing the semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a stage of manufacturing a semiconductor device structure 100. As shown in FIG. 1, the semiconductor device structure 100 includes a substrate 102 having substrate portions 104 extending therefrom and source/drain (S/D) epitaxial features 106 disposed over the substrate portions 104. The substrate 102 may be a semiconductor substrate, such as a bulk silicon substrate. In some embodiments, the substrate 102 may be an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; other suitable materials; or combinations thereof. Possible substrates 102 also include a silicon-on-insulator (SOI) substrate. SOI substrates are fabricated using separation by implantation of oxygen (SIMOX), wafer bonding, and/or other suitable methods. The substrate portions 104 may be formed by recessing portions of the substrate 102. Thus, the substrate portions 104 may include the same material as the substrate 102. The substrate 102 and the substrate portions 104 may include various regions that have been suitably doped with impurities (e.g., p-type or n-type impurities). The dopants are, for example boron for a p-type field effect transistor (PFET) and phosphorus for an n-type field effect transistor (NFET). The S/D epitaxial features 106 may include a semiconductor material, such as Si or Ge, a III-V compound semiconductor, a II-VI compound semiconductor, or other suitable semiconductor material. Exemplary S/D epitaxial features 106 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D epitaxial features 106 may include p-type dopants, such as boron; n-type dopants, such as phosphorus or arsenic; and/or other suitable dopants including combinations thereof.

As shown in FIG. 1, S/D epitaxial features 106 may be connected by one or more semiconductor layers 130, which may be channels of a FET. In some embodiments, the FET is a nanostructure FET including a plurality of semiconductor layers 130, and at least a portion of each semiconductor layer 130 is wrapped around by a gate electrode layer 136. The semiconductor layer 130 may be or include materials such as Si, Ge, SiC, GeAs, GaP, InP, InAs, InSb, GaAsP, AlInAs, AlGaAs, InGaAs, GaInP, GaInAsP, or other suitable material. In some embodiments, each semiconductor layer 130 is made of Si. The gate electrode layer 136 includes one or more layers of electrically conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. In some embodiments, the gate electrode layer 136 includes a metal. A gate dielectric layer 134 may be disposed between the gate electrode layer 136 and the semiconductor layers 130. The gate dielectric layer 134 may include two or more layers, such as an interfacial layer and a high-k dielectric layer. In some embodiments, the interfacial layer is an oxide layer, and the high-k dielectric layer includes hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HfTaO), hafnium titanium oxide (HfTiO), lanthanum oxide (LaO), aluminum oxide (AlO), aluminum silicon oxide (AlSiO), zirconium oxide (ZrO), titanium oxide (TiO), tantalum oxide ($Ta_2O_5$), yttrium oxide ($Y_2O_3$), silicon oxynitride (SiON), hafnium dioxide-alumina ($HfO_2$—$Al_2O_3$) alloy, or other suitable high-k materials.

The gate dielectric layer 134 and the gate electrode layer 136 may be separated from the S/D epitaxial features 106 by inner spacers 132. The inner spacers 132 may include a dielectric material, such as SiON, SiCN, SiOC, SiOCN, or SiN. Spacers 128 may be disposed over the plurality of semiconductor layers 130. The spacers 128 may include a dielectric material such as silicon oxide, silicon nitride, silicon carbide, silicon oxynitride, SiCN, silicon oxycarbide, SiOCN, and/or combinations thereof. In some embodiments, a self-aligned contact (SAC) layer 140 is formed over the spacers 128, the gate dielectric layer 134, and the gate electrode layer 136, as shown in FIG. 1. The SAC layer 140 may include any suitable material such as SiO, SiN, SiC, SiON, SiOC, SiCN, SiOCN, AlO, AlON, ZrO, ZrN, or combinations thereof.

A contact etch stop layer (CESL) 118 and an interlayer dielectric (ILD) layer 120 are disposed over the S/D epitaxial features 106, as shown in FIG. 1. The CESL 118 may include an oxygen-containing material or a nitrogen-containing material, such as silicon nitride, silicon carbon nitride, silicon oxynitride, carbon nitride, silicon oxide, silicon carbon oxide, the like, or a combination thereof. The materials for the ILD layer 120 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. A cap layer 122 may be disposed on the ILD layer 120, and the cap layer 122 may include a nitrogen-containing material, such as SiCN.

Conductive contacts 126 may be disposed in the ILD layer 120 and over the S/D epitaxial features 106, as shown in FIG. 1. The conductive contacts 126 may include one or more electrically conductive material, such as Ru, Mo, Co, Ni. W, Ti, Ta, Cu, Al, TiN and TaN. Silicide layers 124 may be disposed between the conductive contacts 126 and the S/D epitaxial features 106.

As shown in FIG. 1, the semiconductor device structure 100 may include the substrate 102 and a device layer 200 disposed over the substrate 102. The device layer 200 may include one or more devices, such as transistors, diodes, imaging sensors, resistors, capacitors, inductors, memory cells, combinations thereof, and/or other suitable devices. In some embodiments, the device layer 200 includes transistors, such as nanostructure transistors having a plurality of channels wrapped around by the gate electrode layer, as described above. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The channel(s) of the semiconductor device structure 100 may be surrounded by the gate electrode layer. The nanostructure transistors may be referred to as nanosheet transistors, nanowire transistors, gate-all-around (GAA) transistors, multi-bridge channel (MBC) transistors, or any transistors having the gate electrode layer surrounding the channels. In some embodiments, the device layer 200 includes planar FET, FinFET, complementary FET (CFET), forksheet FET, or other suitable devices.

Figure 2B:
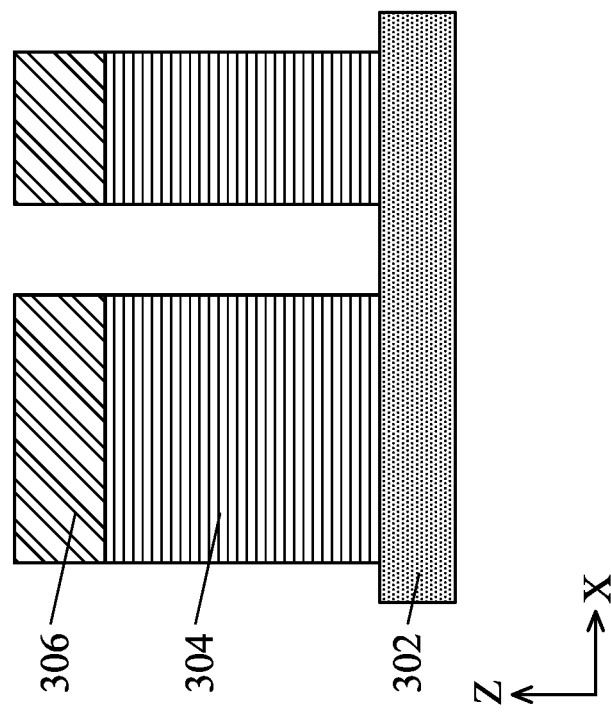
FIGS. 2A-2E are cross-sectional side views of various stages of manufacturing an interconnection structure, in accordance with some embodiments.
Figure 2A:
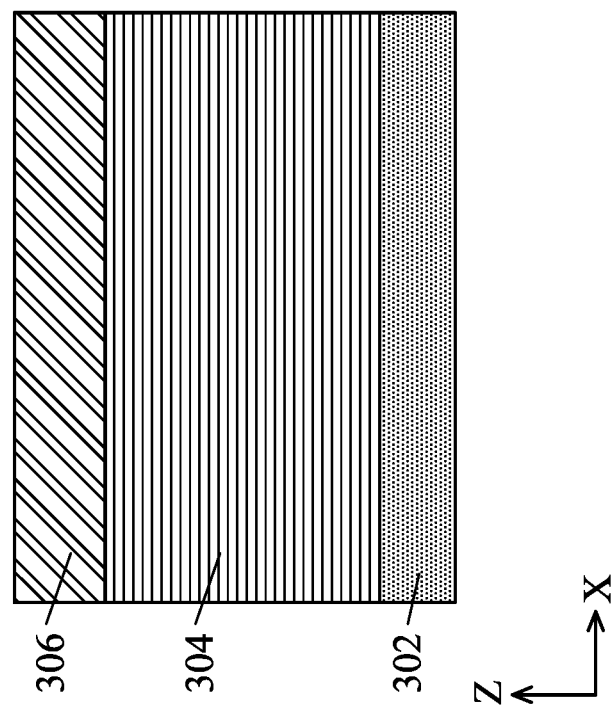

FIGS. 2A-2E are cross-sectional side views of various stages of manufacturing an interconnection structure 300, in accordance with some embodiments. As shown in FIG. 2A, the interconnection structure 300 includes a dielectric layer 302, which may be an ILD layer or an intermetal dielectric (IMD) layer. For example, the dielectric layer 302 may be the ILD layer 120. In some embodiments, the dielectric layer 302 may be disposed over the ILD layer 120 (FIG. 1). In some embodiments, the dielectric layer 302 may be disposed on the cap layer 122 (FIG. 1). The dielectric layer 302 may include one or more conductive features (not shown) disposed therein. The dielectric layer 302 may include an oxygen-containing material, such as silicon oxide or fluorine-doped silicate glass (FSG); a nitrogen-containing material, such as silicon nitride, silicon oxynitride (SiON), SiOCN, SiCN; a low-k dielectric material (e.g., a material having a k value lower than that of the silicon oxide); a carbon-containing material, such as SiC, SiOC, or any suitable dielectric material. The dielectric layer 302 may be formed by chemical vapor deposition (CVD), atomic layer deposition (ALD), spin coating, physical vapor deposition (PVD) or other suitable process.

As shown in FIG. 2A, a two-dimensional (2D) material layer 304 and a mask layer 306 are formed over the dielectric layer 302. The term "2D material" used in this disclosure refers to single layer material or monolayer-type material that is atomically thin crystalline solids having intralayer covalent bonding and interlayer van der Waals bonding. Examples of a 2D material may include graphene, hexagonal-BN, or transition metal dichalcogenides ($MX_2$), where M is a transition metal element and X is a chalcogenide element. Some exemplary $MX_2$ materials may include, but are not limited to Hf, $Te_2$, $WS_2$, $MoS_2$, $WSe_2$, $MoSe_2$, or any combination thereof. The 2D material layer 304 may include 5 to 1000 layers of the 2D material and may include p-type or n-type materials intercalated in the layers of the 2D material. The p-type or n-type materials may include K, Rb, Cs, Li, $Br_2$, $HNO_3$, $NiCl_2$, $AlCl_3$, $FeCl_3$, $AuCl_3$, $MoCl_5$, $SbCl_5$, $SbF_5$, $AsF_5$, or other suitable material. In some embodiments, the 2D material layer 304 includes 5 to 1000 layers of graphene and has a total thickness ranging from about 1.5 nm to about 335 nm. In some embodiments, the 2D material layer 304 includes 100 to 500 layers of graphene and has a total thickness ranging from about 33.5 nm to about 167.5 nm. The 2D material layer 304 may be formed by CVD, plasma enhanced CVD (PECVD), ALD, transfer techniques, or other suitable process.

The mask layer 306 may include SiN, SiON, $SiO_2$, the like, or a combination thereof, and may be formed by CVD, ALD, spin coating, or other suitable process. The mask layer 306 may be a single layer or a multi-layer structure.

As shown in FIG. 2B, one or more openings are formed in the mask layer 306 and the 2D material layer 304. In some embodiments, an etch stop layer (not shown) may be formed between the mask layer 306 and the 2D material layer 304. The openings may be formed by first patterning the mask layer 306 followed by transferring the pattern of the mask layer 306 to the 2D material layer 304 (and the etch stop layer in some embodiments). The patterning of the mask layer 306 and the transferring of the pattern of the mask layer 306 may include one or more etch process, such as dry etch, wet etch, or a combination thereof. In some embodiments, the openings in the 2D material layer 304 are formed by a plasma etch process using one or more etchants such as oxygen gas, nitrogen gas, ammonia, or other suitable etchants. The plasma may be in-situ or remote. In some embodiments, the openings in the 2D material layer 304 are formed by a wet etch process using ammonia.

The openings separate the 2D material layer 304 into one or more portions, such as a plurality of portions. In some embodiments, each portion of the 2D material layer 304 is a conductive feature, such as a conductive line. Traditionally, the conductive features are made of a metal, such as copper. However, as the dimensions of the conductive features decrease to a certain level, the sheet resistance and the contact resistance of the traditional metallic conductive features increase. By using the 2D material as the conductive features, the sheet resistance and contact resistance are less compared to the metallic conductive features, because the intrinsic sheet resistance of the 2D material does not increase when the dimensions decrease. For example, if the width of the conductive features, which is along the X-axis, is in a range from about 5 nm to about 50 nm, the conductive features made of the 2D material has lower sheet resistance and contact resistance compared to the metallic conductive features. As shown in FIG. 2B, each portion of the 2D material layer 304 may have a critical dimension (CD), which is the width along the X-axis, less than about 50 nm, such as from about 5 nm to about 50 nm. One or more of the portions of the 2D material layer 304 may be electrically connected to the conductive contacts 126 and/or the gate electrode layer 136.

Figure 2D:
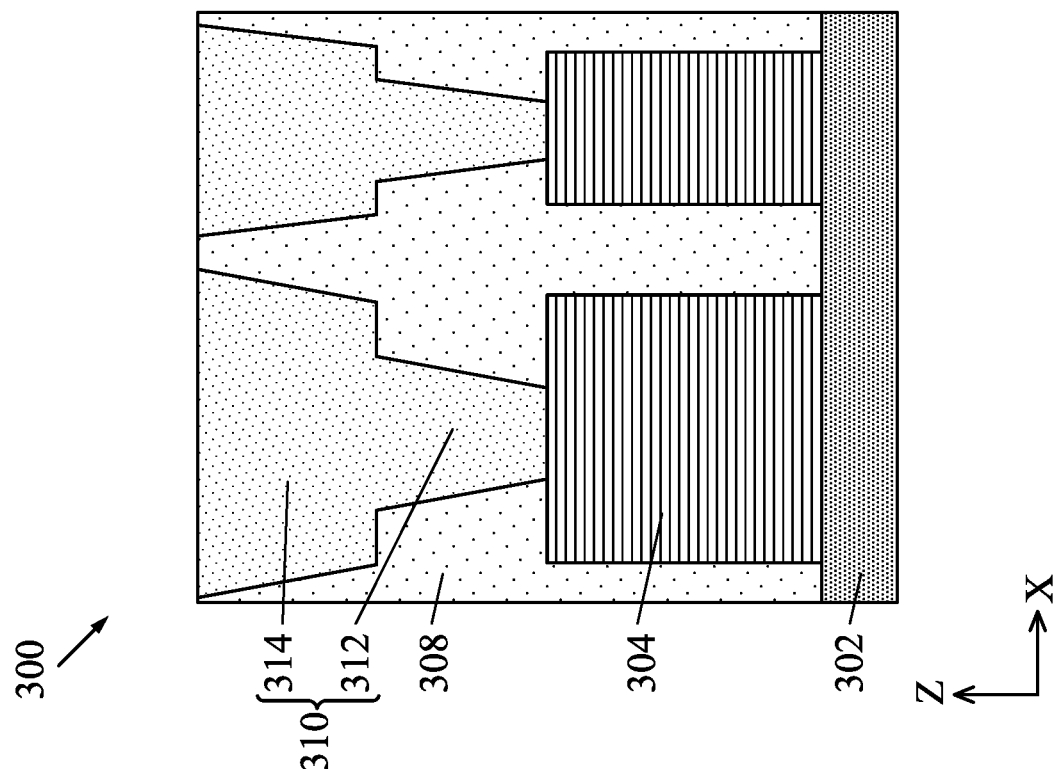
Figure 2C:
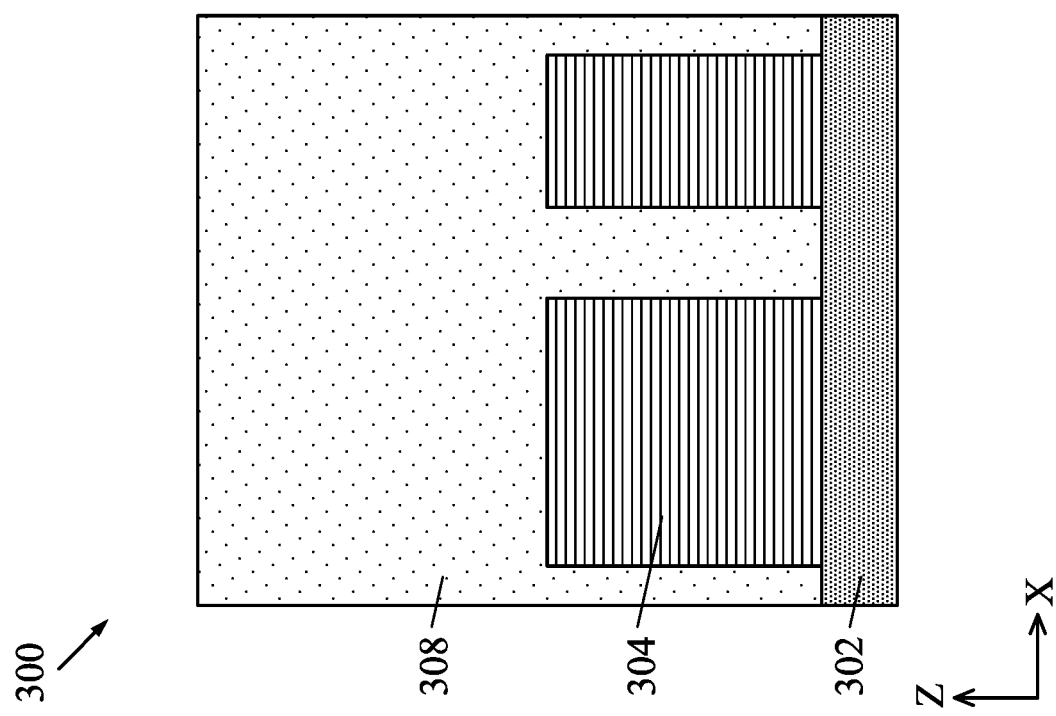

As shown in FIG. 2C, the mask layer 306 is removed and a dielectric material 308 is formed in the openings and over the 2D material layer 304. The mask layer 306 may be removed by any suitable process, such as dry etch, wet etch, or a combination thereof. In some embodiments, the removal of the mask layer 306 is a selective etch process that removes the mask layer 306 but does not substantially affect the etch stop layer (not shown) or the 2D material layer 304. The dielectric material 308 may be formed on the etch stop layer (not shown) and in the openings. The dielectric material 308 may include the same material as the dielectric layer 302. In some embodiments, the dielectric material 308 includes a low-k dielectric material, such as porous low-k dielectric material or a low-k dielectric material with air gaps formed therein. A planarization process may be performed so a top surface of the dielectric material 308 is substantially flat. The planarization process may be any suitable process, such as a chemical-mechanical polishing (CMP) process. The dielectric material 308 may be formed by any suitable process, such as spin coating, CVD, ALD, or PVD. Because the 2D material layer 304 includes a material not susceptible to diffusion, barrier layers between the 2D material layer 304 and the dielectric material 308 are not needed. The dielectric material 308 may be formed in the openings and over the portions of the 2D material layer 304, and conductive features 310 (FIG. 2D) are formed in the portion of the dielectric material 308 formed over the portions of the 2D material layer 304. Thus, the dielectric material 308 may function as two ILD or IMD layers.

As shown in FIG. 2D, the conductive features 310 are formed in the dielectric material 308 and over the 2D material layer 304. The conductive feature 310 may include an electrically conductive material, such as Ag, Ti, Cr, Cu, Al, Ru, Co, Au, W, Mo, Mn, Fe, Pd, Ni, Pt, or semi-metals. In some embodiments, the conductive feature 310 includes a metal. The conductive features 310 may be formed by any suitable process, such as PVD, CVD, electro-chemical plating (ECP), ALD, e-beam, spin coating, or thermal evaporation. As shown in FIG. 2D, the conductive feature 310 may include a first portion 312 disposed on and in contact with the 2D material layer 304 and a second portion 314 over the first portion 312. The second portion 314 may have larger dimensions than the first portion 312. In some embodiments, the first portion 312 of the conductive feature 310 may be a conductive via, and the second portion 314 of the conductive feature 310 may be a conductive line. The conductive feature 310 may be formed by a dual damascene process. As shown in FIG. 2D, the portion of the dielectric material 308 formed in the openings may be continuously extending from the level of a bottom of the portion of the 2D material layer 304 to the level of a top of the conductive feature 310.

Figure 2E:
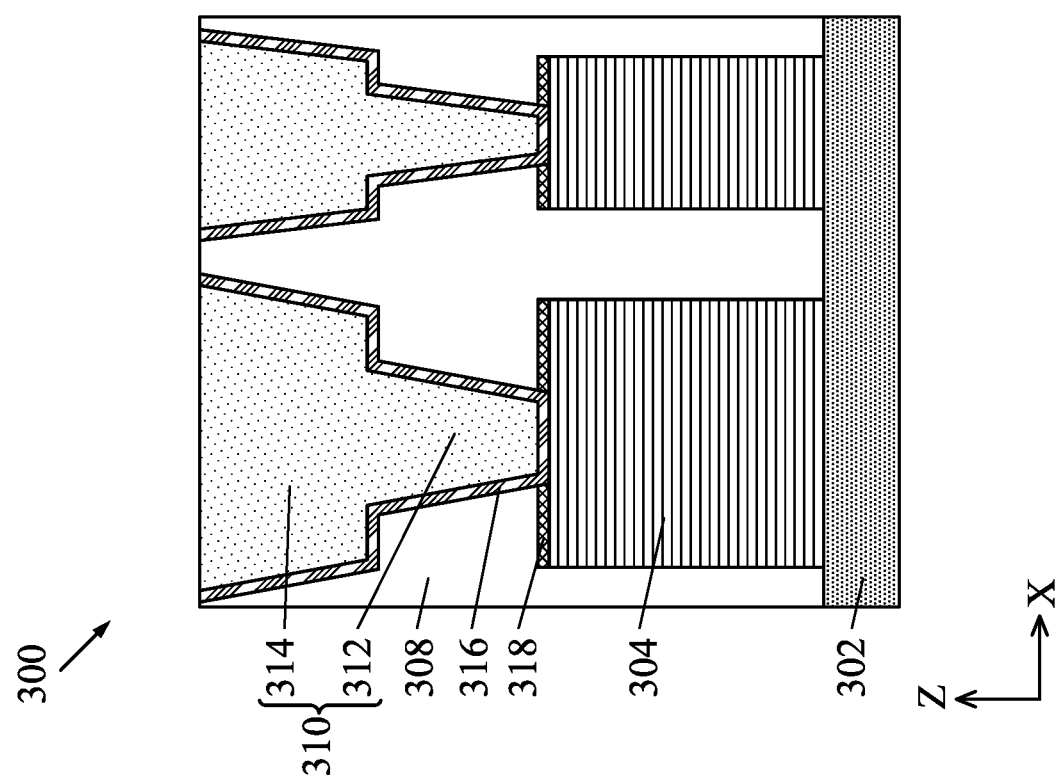

In some embodiments, the conductive feature 310 is a metal that is not susceptible to diffusion, such as ruthenium, and the conductive feature 310 is in contact with the portion of the 2D material layer 304. A barrier layer is not formed between the conductive feature 310 and the portion of the 2D material layer 304, leading to even further reduced contact resistance. In some embodiments, the conductive feature 310 is formed of a metal that is susceptible to diffusion, such as copper, and a barrier layer may be formed between the conductive feature 310 and the dielectric material 308 to prevent the metal diffusion from the conductive feature 310 to the dielectric material 308. As shown in FIG. 2E, which is an alternative embodiment to the interconnection structure 300 shown in FIG. 2D, a barrier layer 316 is formed between the conductive feature 310 and the dielectric material 308 and between the conductive feature 310 and the 2D material layer 304. The barrier layer 316 may include Co, W, Ru, Al, Mo, Ti, TiN, TiSi, CoSi, NiSi, Cu, TaN, Ni, or TiSiNi and may be formed by any suitable process, such as PVD, ALD, or PECVD. In some embodiments, the barrier layer 316 may be a conformal layer formed by a conformal process, such as ALD. The interconnection structure 300 shown in FIG. 2E also includes an etch stop layer 318 disposed on the 2D material layer 304. The etch stop layer 318 may be formed between the 2D material layer 304 and the mask layer 306 (FIG. 2A), and the etch stop layer 318 may be present in the interconnection structure 300 shown in FIG. 2D. The etch stop layer 318 may include SiO, SiN, SiC, SiON, SiOC, or other suitable material. The etch stop layer 318 may be formed by any suitable process, such as CVD, ALD, or spin coating. In some embodiments, the etch stop layer 318 is a conformal layer and is formed by ALD.

Figure 3B:
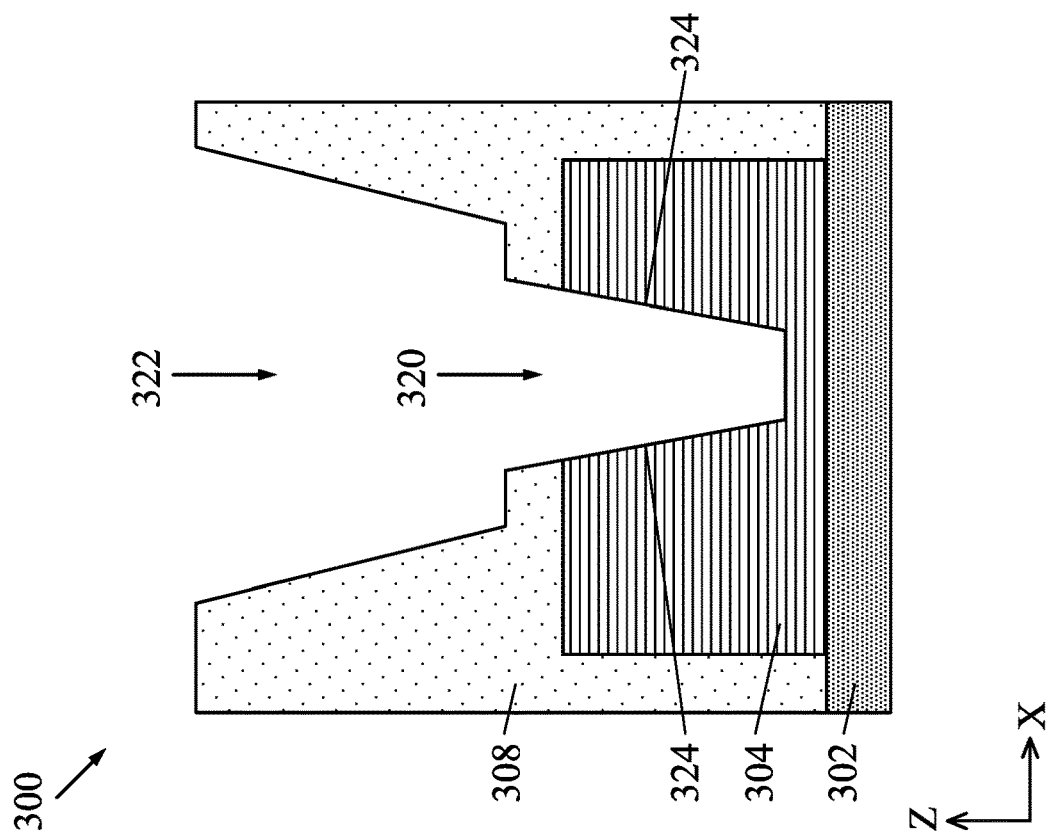
Figure 3A:
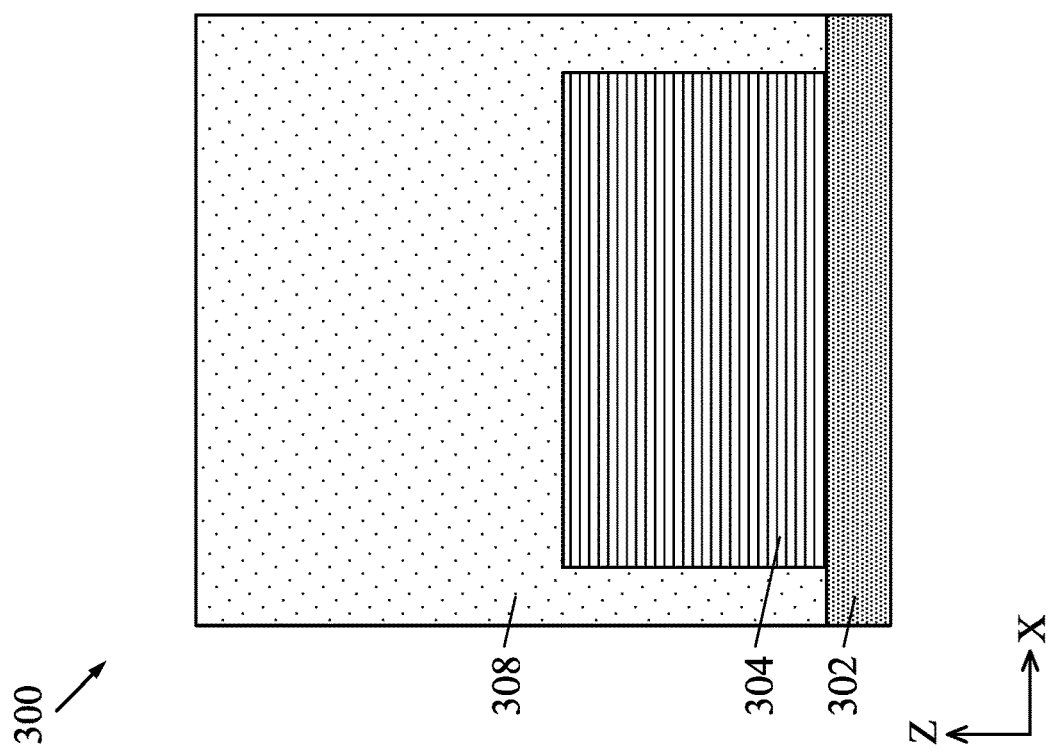

FIGS. 3A-3D are cross-sectional side views of various stages of manufacturing the interconnection structure 300, in accordance with alternative embodiments. As shown in FIG. 3A, the openings are formed in the 2D material layer 304, and the dielectric material 308 is formed in the openings and over the 2D material layer 304. In some embodiments, the etch stop layer 318 (FIG. 2E) may be formed on the top surface of the 2D material layer 304, and the dielectric material 308 is formed on the etch stop layer 318. A portion of the 2D material layer 304, or a conductive feature, is shown in FIG. 3A, and multiple portions of the 2D material 304 (not shown), or multiple conductive features, may be formed on the dielectric layer 302. The top surface of the dielectric material 308 may be substantially flat, as a result of the planarization process. The interconnection structure 300 shown in FIG. 3A may be at the same manufacturing stage as the interconnection structure 300 shown in FIG. 2C.

As shown in FIG. 3B, a first opening 320 is formed in the portion of the 2D material layer 304 and in a portion of the dielectric material 308. In some embodiments, the first opening 320 is also formed in the etch stop layer 318 (FIG. 2E). A second opening 322 is formed in a portion of the dielectric material 308 over the first opening 320. The second opening 322 may have dimensions greater than those of the first opening 320. The first opening 320 may be formed before or after the second opening 322. In some embodiments, an etch stop layer (not shown) may be embedded in the dielectric material 308 to facilitate the formation of the first and second openings 320, 322. The first opening 320 and the second opening 322 may be formed by one or more etch processes, such as dry etch, wet etch, or a combination thereof. Side surfaces 324 of the portion of the 2D material layer 304 are exposed in the first opening 320. The process of forming the first opening 320 is controlled so that the bottom of the first opening 320 is the portion of the 2D material layer 304, and the conductive features (not shown) disposed in the dielectric layer 302 are not exposed.

As shown in FIG. 3C, the conductive feature 310 is formed in the first and second openings 320, 322. The first portion 312 of the conductive feature 310 may be formed in the first opening 320 (FIG. 3B), and the second portion 314 of the conductive feature 310 may be formed in the second opening 322 (FIG. 3B). The side surfaces 324 of the portion of the 2D material layer 304 are in contact with the first portion 312 of the conductive feature 310, and the contact resistance may be further reduced due to excellent electrical conduction of the 2D material in the in-plane direction compared to the through-plane direction. The in-plane direction is along the X-axis, and the through-plane direction is along the Z-axis. The interconnection structure 300 shown in FIG. 3C has reduced contact resistance compared to the interconnection structure 300 shown in FIG. 2D, because the directions of the electrical conduction between the conductive feature 310 and the portion of the 2D material layer 304 shown in FIG. 3C is in-plane and through-plane, while the direction of the electrical conductive between the conductive feature 310 and the portion of the 2D material layer 304 shown in FIG. 2D is through-plane. As described above, the conductive feature 310 may include a metal that is not susceptible to diffusion, and the barrier layer is omitted.

As shown in FIG. 3D, the barrier layer 316 is formed between the conductive feature 310 and the dielectric material 308 and between the conductive feature 310 and the portion of the 2D material layer 304. The conductive feature 310 may include a metal that is susceptible to diffusion, and the barrier layer 316 prevents the diffusion from the conductive feature 310 to the dielectric material 308. Because portions of the barrier layer 316 formed on the first portion 312 of the conductive feature 310 are in contact with the side surfaces 324 of the portion of the 2D material layer 304, the contact resistance is reduced compared to the interconnection structure 300 shown in FIG. 2E.

Figure 4B:
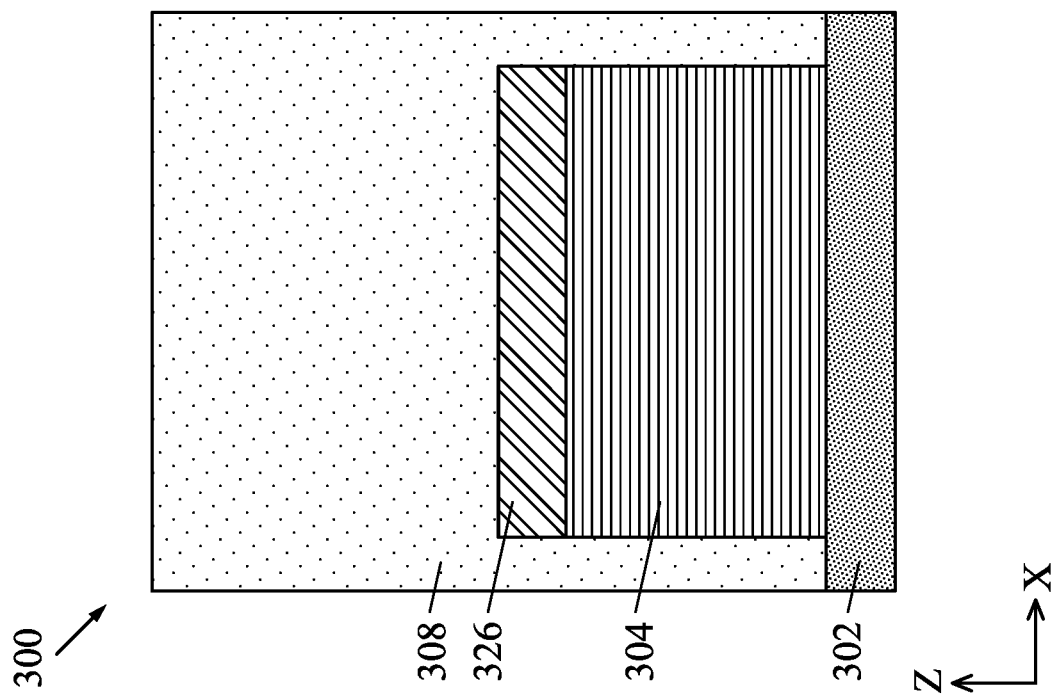
FIGS. 4A-4D are cross-sectional side views of various stages of manufacturing the interconnection structure, in accordance with alternative embodiments.
Figure 4A:
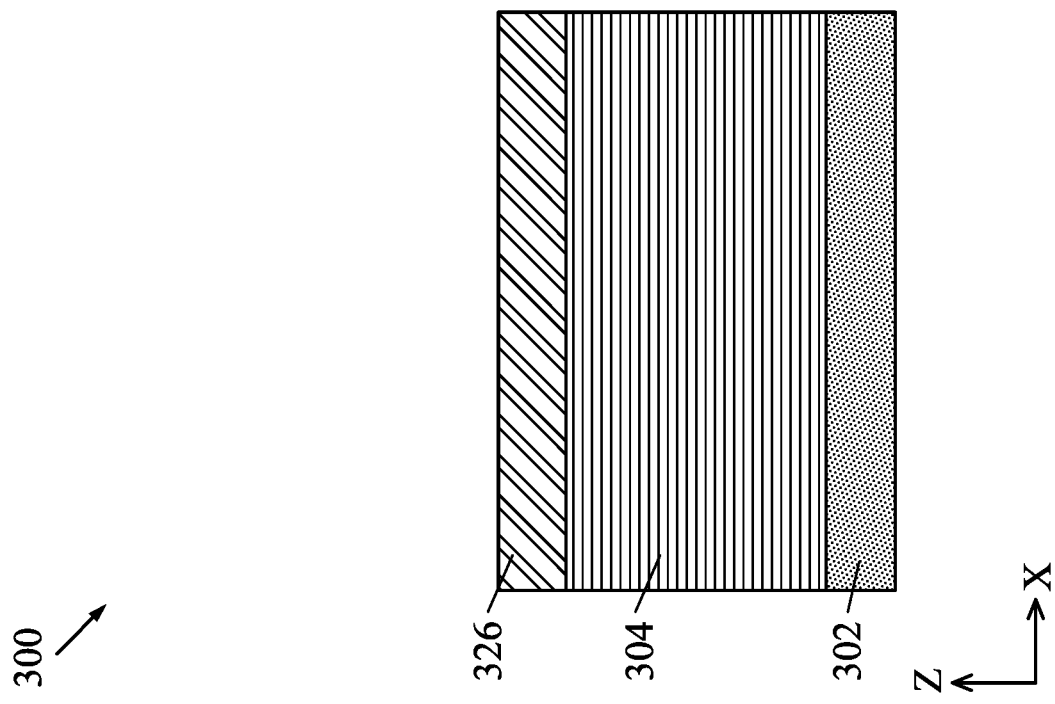

FIGS. 4A-4D are cross-sectional side views of various stages of manufacturing the interconnection structure 300, in accordance with alternative embodiments. As shown in FIG. 4A, a conductive layer 326 is formed on the 2D material layer 304, and an optional mask layer (not shown) may be formed on the conductive layer 326. The conductive layer 326 may include an electrically conductive material, such as Ag, Ti, Cr, Cu, Al, Ru, Co, Au, W, Mo, Mn, Fe, Pd, Ni, Pt, or semi-metals. The conductive layer 326 may be formed by any suitable process, such as PVD, CVD, ALD, ECP, e-beam, spin coating, or thermal evaporation. An etch stop layer (not shown) may be formed between the 2D material layer 304 and the conductive layer 326.

As shown in FIG. 4B, the openings are formed in the 2D material layer 304 and the conductive layer 326, and the dielectric material 308 is formed in the openings and over the conductive layer 326. In some embodiments, the etch stop layer 318 (FIG. 2E) may be formed on the top surface of the conductive layer 326, and the dielectric material 308 is formed on the etch stop layer 318. A portion of the conductive layer 326 and a portion of the 2D material layer 304 together may be referred to as a conductive feature, and one conductive feature is shown in FIG. 4B. Multiple conductive features may be formed on the dielectric layer 302. The top surface of the dielectric material 308 may be substantially flat, as a result of the planarization process. In some embodiments, the conductive layer 326 includes a metal that is not susceptible to diffusion, thus, there is no barrier layer formed between the conductive layer 326 and the dielectric material 308.

Figure 4D:
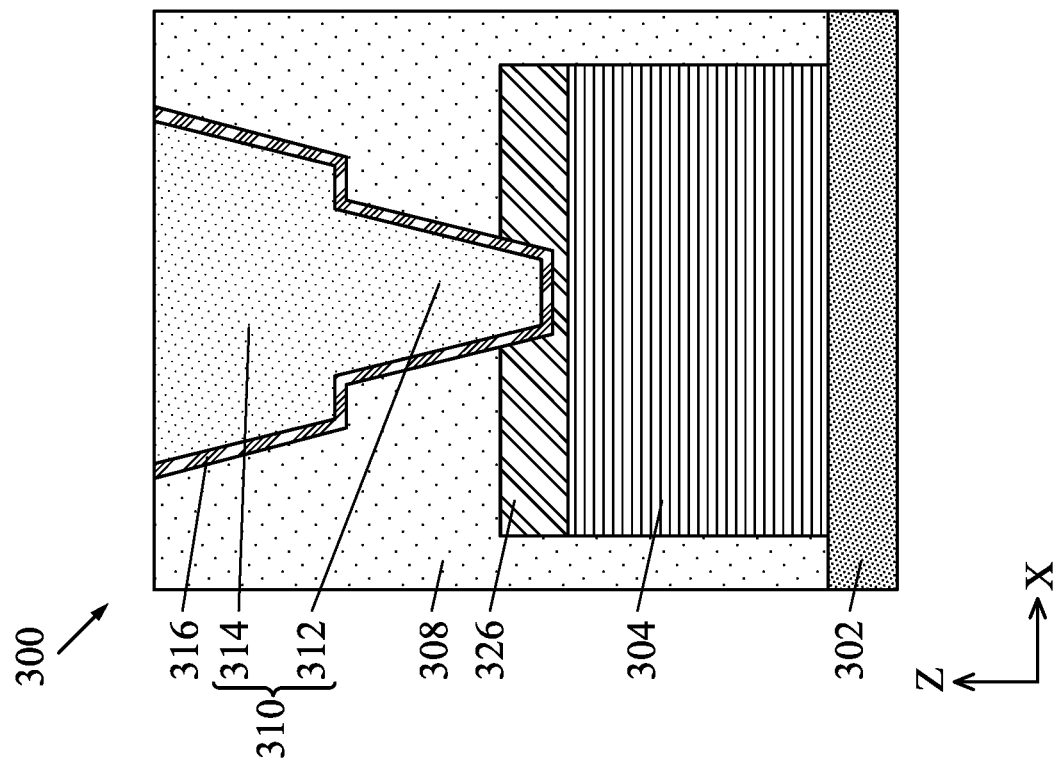
Figure 4C:
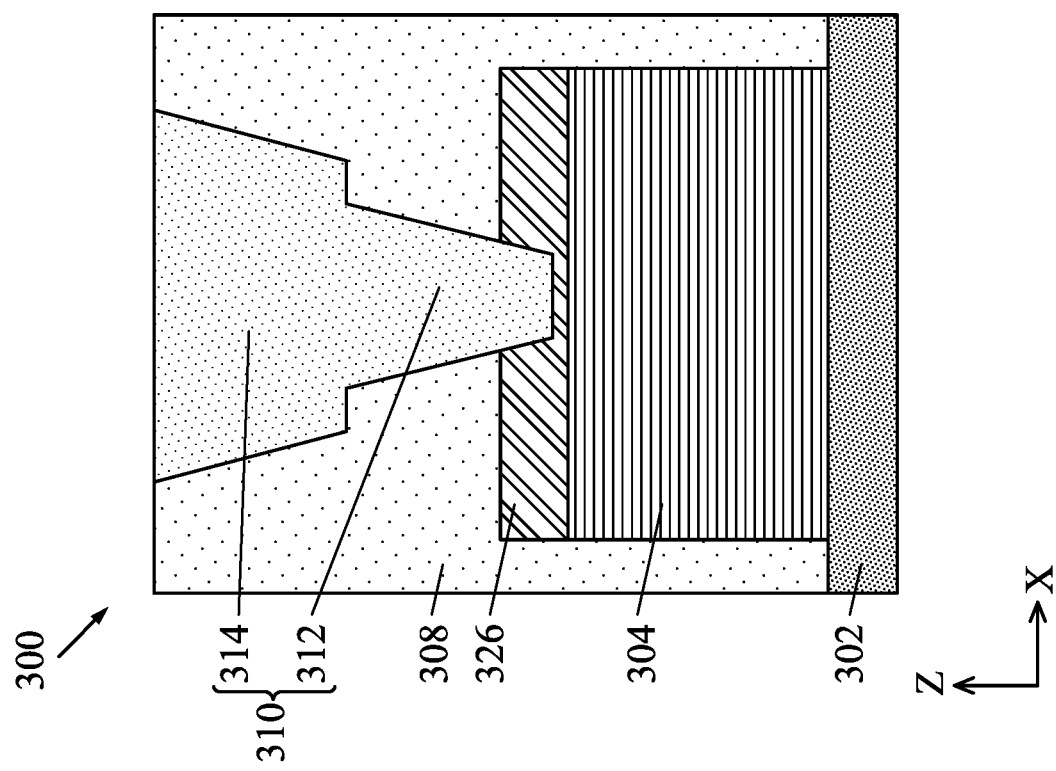

As shown in FIG. 4C, the conductive feature 310 is formed in the dielectric material 308 and in a portion of the conductive layer 326. For example, the first portion 312 of the conductive feature 310 may be formed in the portion of the conductive layer 326. In some embodiments, the first portion 312 of the conductive feature 310 may have a bottom surface that is in contact with the portion of the conductive layer 326, as shown in FIG. 4C. In some embodiments, the first portion 312 of the conductive feature 310 extends through the portion of the conductive layer 326, and the bottom surface of the first portion 312 of the conductive feature 310 is in contact with the portion of the 2D material layer 304. In some embodiments, the conductive feature 310 is a metal that is not susceptible to diffusion, such as ruthenium. Thus, the barrier layer 316 is omitted. The conductive feature 310 and the portion of the conductive layer 326 form a metal-to-metal junction, which further reduces contact resistance.

As shown in FIG. 4D, the barrier layer 316 is formed between the conductive feature 310 and the dielectric material 308 and between the conductive feature 310 and the portion of the conductive layer 326. The conductive feature 310 may include a metal that is susceptible to diffusion, and the barrier layer 316 prevents the diffusion from the conductive feature 310 to the dielectric material 308.

Figure 5B:
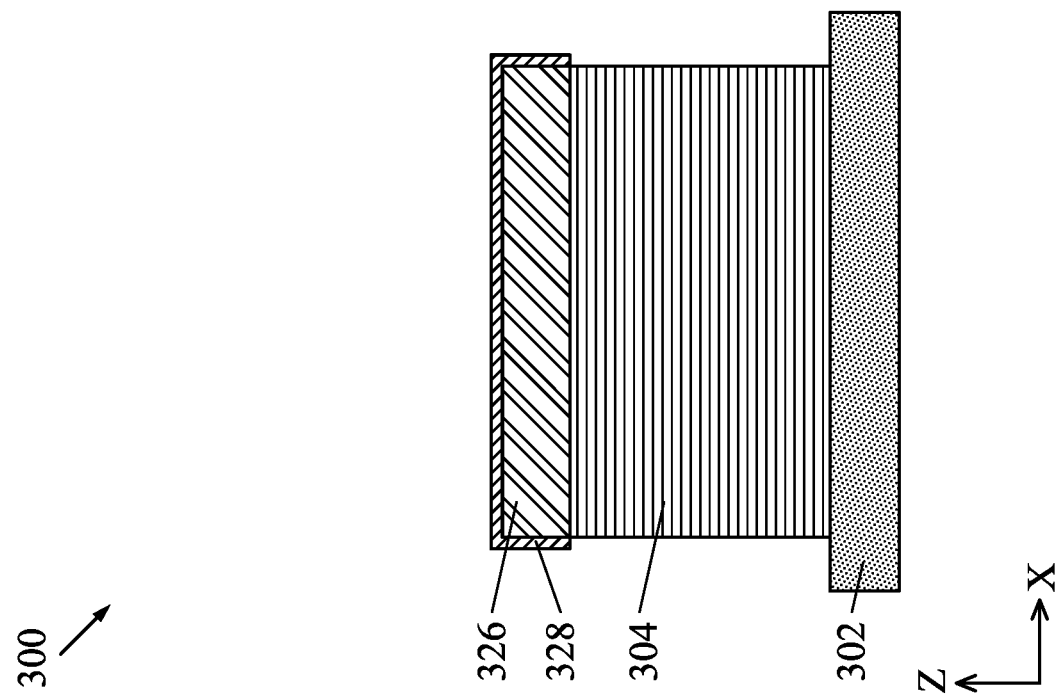
FIGS. 5A-5D are cross-sectional side views of various stages of manufacturing the interconnection structure, in accordance with alternative embodiments.
Figure 5A:
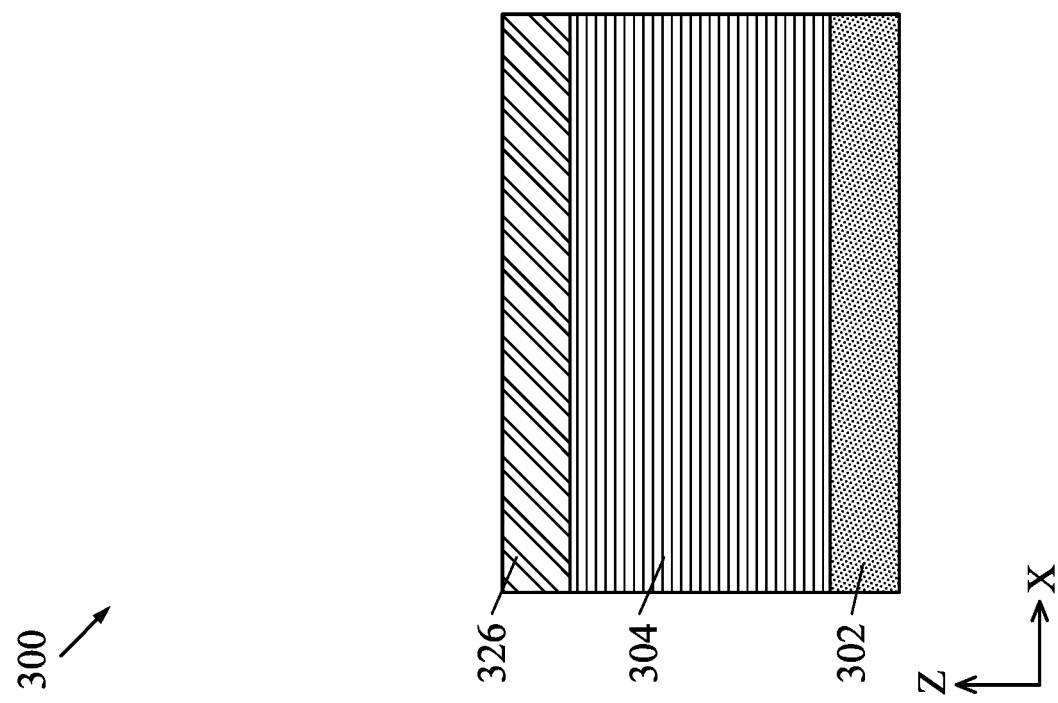

FIGS. 5A-5D are cross-sectional side views of various stages of manufacturing the interconnection structure 300, in accordance with alternative embodiments. As shown in FIG. 5A, the conductive layer 326 is formed on the 2D material layer 304, and an optional mask layer (not shown) may be formed on the conductive layer 326. An etch stop layer (not shown) may be formed between the 2D material layer 304 and the conductive layer 326. In some embodiments, the conductive layer 326 include a metal that is susceptible to diffusion.

Figure 5D:
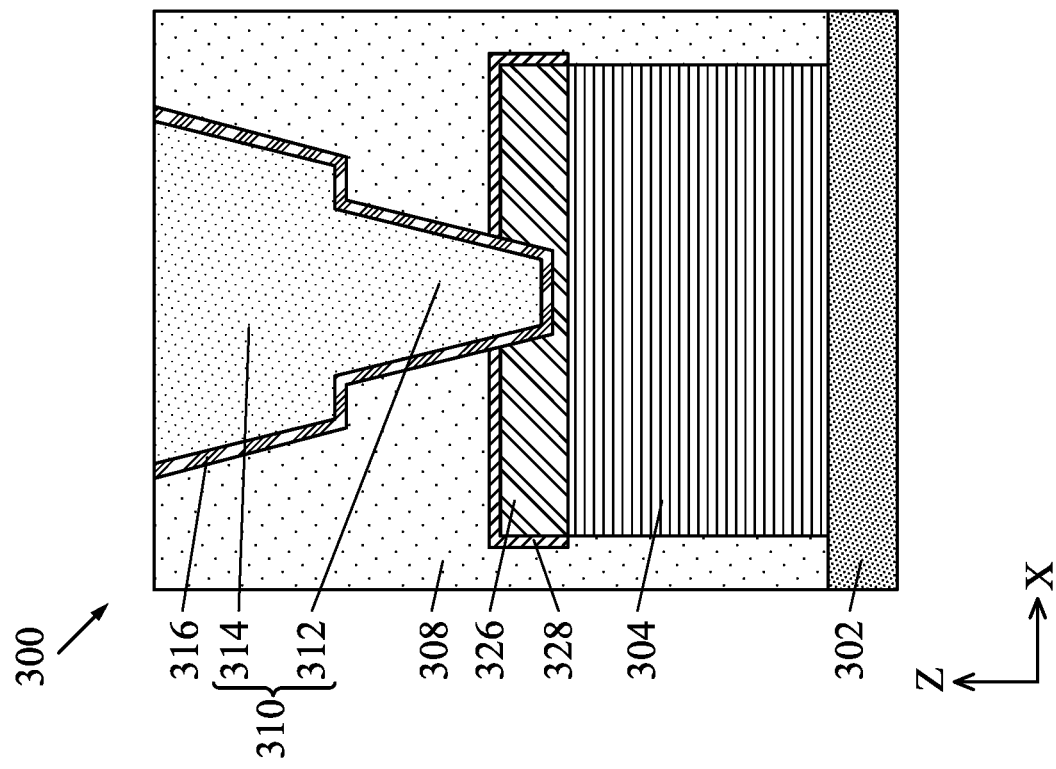
Figure 5C:
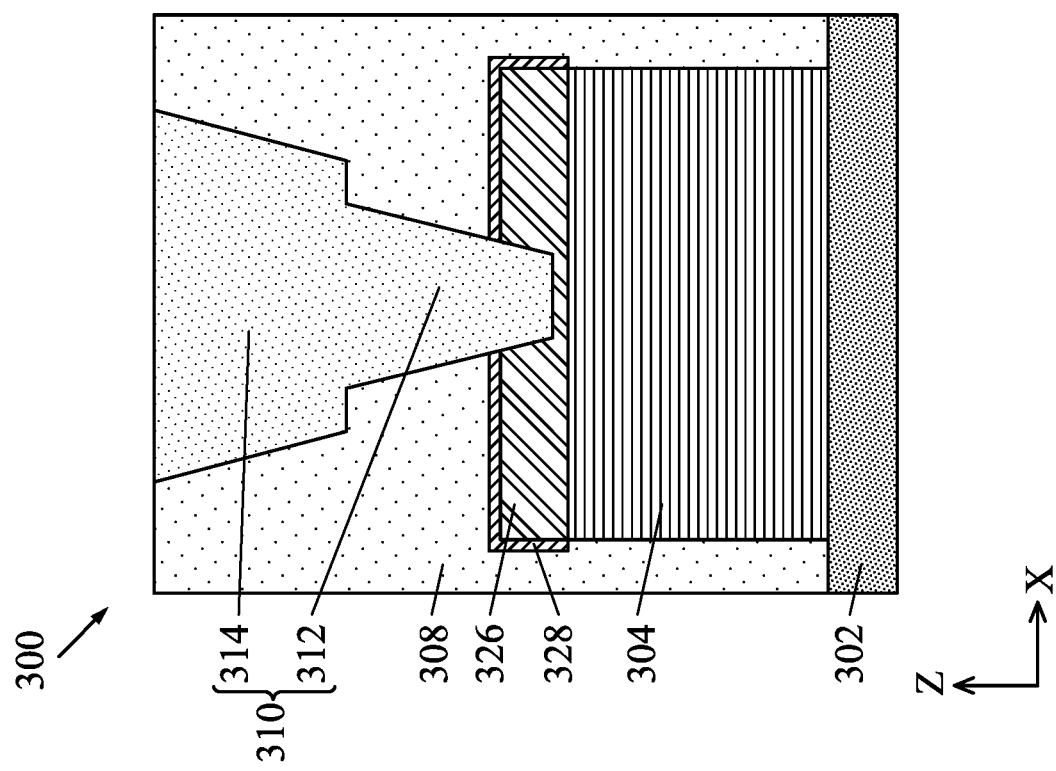

As shown in FIG. 5B, the openings are formed in the 2D material layer 304 and the conductive layer 326, and a barrier layer 328 is selectively formed on each portion of the conductive layer 326. The barrier layer 328 prevents the diffusion of the metal from the conductive layer 326 to the dielectric material 308 (FIG. 5C). The barrier layer 328 may be formed on each portion of the conductive layer 326 by any suitable selective process. In some embodiments, prior to forming the barrier layer 328, blocking layers (not shown) may be formed on the exposed surfaces of the portions of the 2D material layer 304. For example, the blocking layers may include one or more self-assembled monolayers (SAMs) of a blocking compound having a head group and a tail group. In some embodiments, the head group of the blocking compound includes carbon. The head group of the blocking compound may only attach to the surfaces of the portions of the 2D material layer 304 and may not attach to the metallic surface of the portions of the conductive layer 326. The tail group of the blocking compound may include hydroxyl group which blocks adsorption of a precursor (e.g., the precursor for forming the barrier layer 328) for forming on the portions of the 2D material layer 304. Furthermore, the exposed surfaces of the dielectric layer 302 may be treated to prevent the adsorption of the precursor of the barrier layer 328. As a result, the barrier layer 328 is selectively formed on the exposed surfaces of the portions of the conductive layer 326 and is not substantially formed on the blocking layers and the dielectric layer 302. The blocking layers are removed after the formation of the barrier layers 328. The barrier layer 328 may include the same material as the barrier layer 316.

As shown in FIG. 5C, the dielectric material 308 is formed in the openings and over the barrier layer 328, and the conductive feature 310 is formed in the dielectric material 308 and in a portion of the conductive layer 326. In some embodiments, the conductive feature 310 is a metal that is not susceptible to diffusion, such as ruthenium. Thus, the barrier layer 316 is omitted. In some embodiments, the conductive feature 310 is a metal that is susceptible to diffusion, and the barrier layer 316 is formed between the conductive feature 310 and the dielectric material 308 and between the conductive feature 310 and the portion of the conductive layer 326, as shown in FIG. 5D. The barrier layer 316 prevents the diffusion from the conductive feature 310 to the dielectric material 308.

Figure 6B:
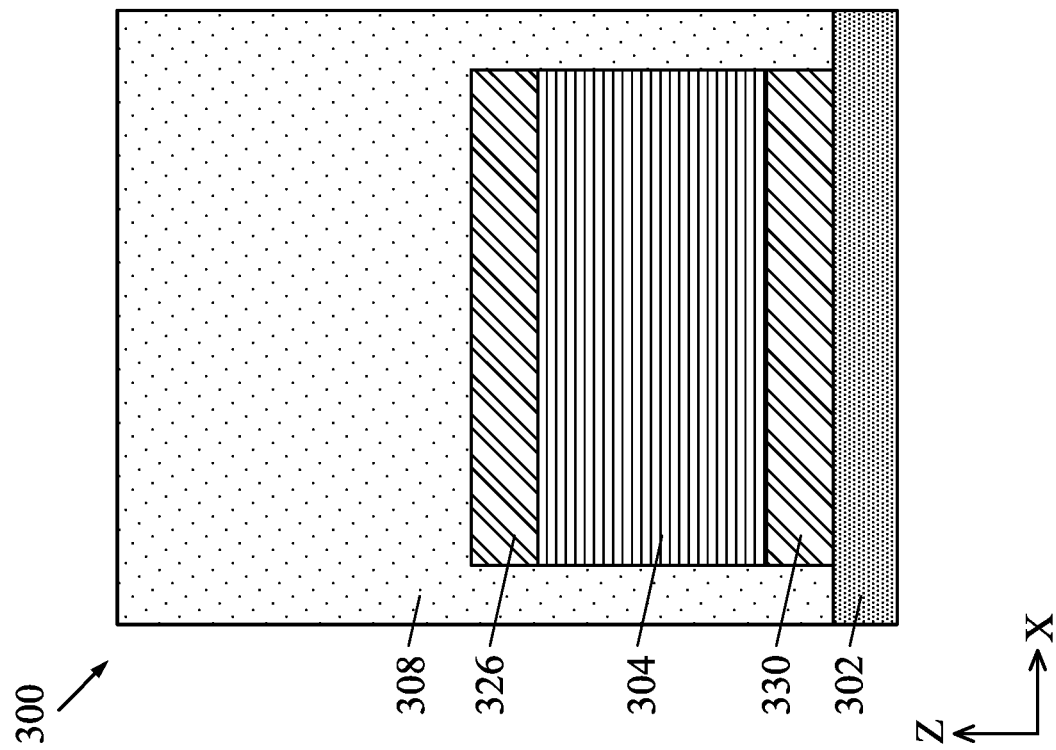
FIGS. 6A-6D are cross-sectional side views of various stages of manufacturing the interconnection structure, in accordance with alternative embodiments.
Figure 6A:
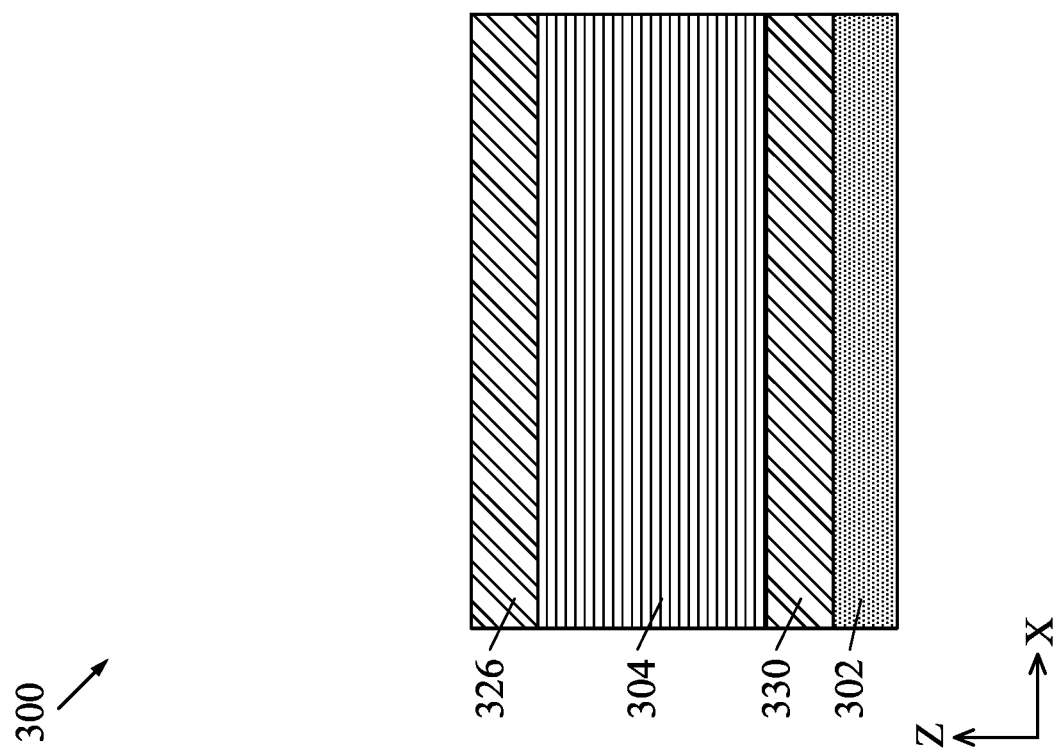

FIGS. 6A-6D are cross-sectional side views of various stages of manufacturing the interconnection structure 300, in accordance with alternative embodiments. As shown in FIG. 6A, a conductive layer 330 is formed on the dielectric layer 302, the 2D material layer 304 is formed on the conductive layer 330, and the conductive layer 326 is formed on the 2D material layer 304. The conductive layer 330 may include the same material as the conductive layer 326 and may be formed by the same process as the conductive layer 326.

As shown in FIG. 6B, the openings are formed in the conductive layer 330, the 2D material layer 304, and the conductive layer 326, and the dielectric material 308 is formed in the openings and over the conductive layer 326. A portion of the conductive layer 326, a portion of the 2D material layer 304, and a portion of the conductive layer 330 together may be referred to as a conductive feature, and one conductive feature is shown in FIG. 6B. Multiple conductive features may be formed on the dielectric layer 302. The top surface of the dielectric material 308 may be substantially flat, as a result of the planarization process. In some embodiments, the conductive layer 326 and the conductive layer 330 include a metal that is not susceptible to diffusion, thus, there are no barrier layers formed between the conductive layers 326, 330 and the dielectric material 308. In some embodiments, the conductive layer 326 and the conductive layer 330 include a metal that is susceptible to diffusion, and the barrier layer 328 (FIG. 5C) is formed between each portion of the conductive layer 326 and the dielectric material 308 and between each portion of the conductive layer 330 and the dielectric material 308.

Figure 6D:
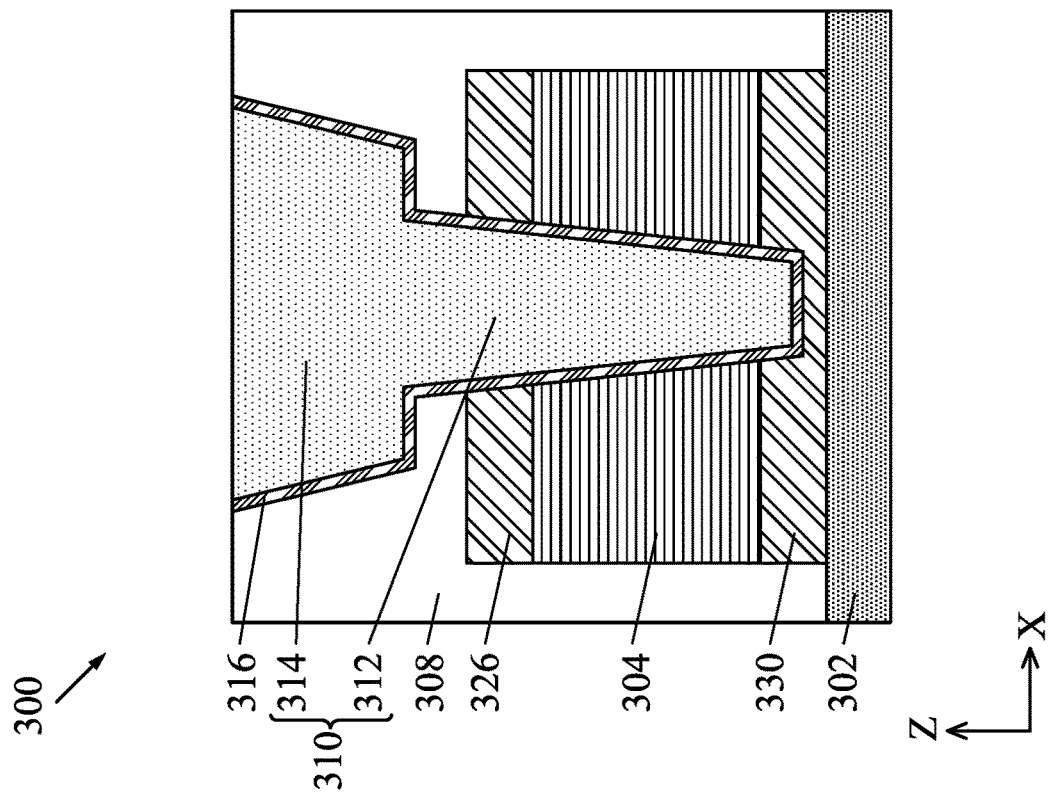
Figure 6C:
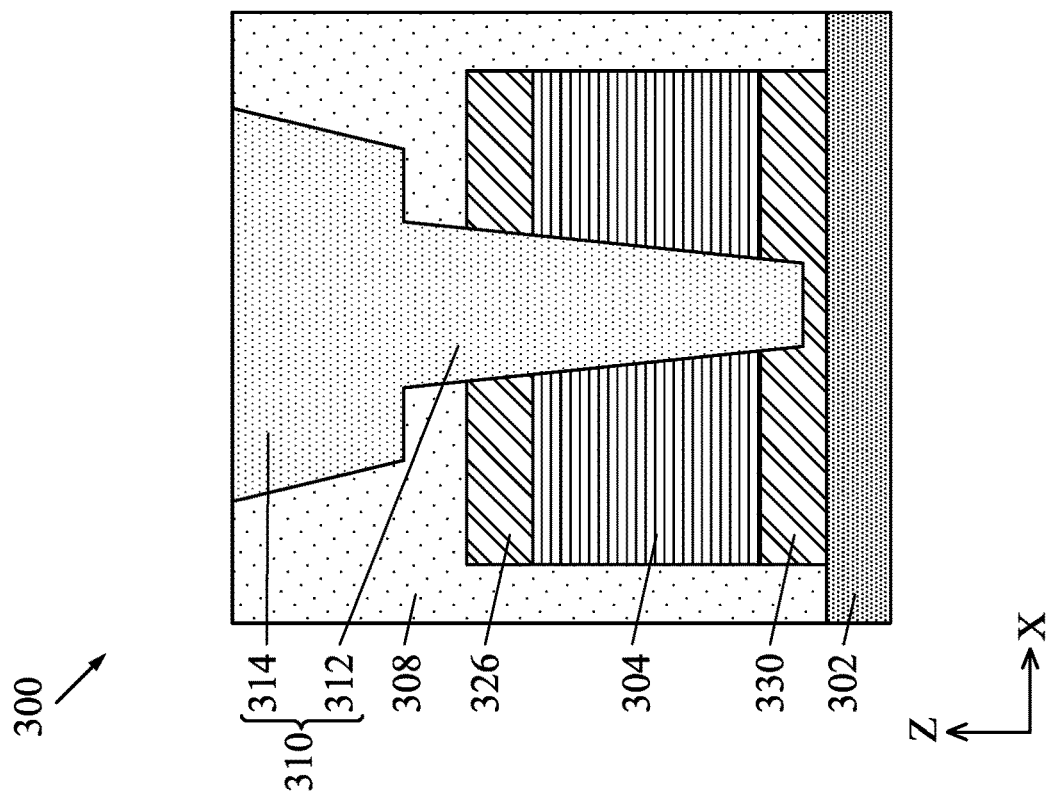

As shown in FIG. 6C, the conductive feature 310 is formed in the dielectric material 308, a portion of the conductive layer 326, a portion of the 2D material layer 304, and a portion of the conductive layer 330. For example, the first portion 312 of the conductive feature 310 may be formed through the portion of the conductive layer 326, the portion of the 2D material layer 304, and in the portion of the conductive layer 330. In some embodiments, the first portion 312 of the conductive feature 310 may have a bottom surface that is in contact with the portion of the conductive layer 330, as shown in FIG. 6C. As shown in FIG. 6C, the portion of the dielectric material 308 formed in the openings may be continuously extending from the level of a bottom of the portion of the conductive layer 330 to the level of a top of the conductive feature 310. In some embodiments, the conductive feature 310 is a metal that is not susceptible to diffusion, such as ruthenium. Thus, the barrier layer 316 is omitted. The electric current may be conducted through both metal-to-2D material and metal-to-metal, which may further reduce contact resistance.

As shown in FIG. 6D, the barrier layer 316 is formed between the conductive feature 310 and the dielectric material 308 and between the conductive feature 310 and the portion of the conductive layer 326. The conductive feature 310 may include a metal that is susceptible to diffusion, and the barrier layer 316 prevents the diffusion from the conductive feature 310 to the dielectric material 308.

Figure 7B:
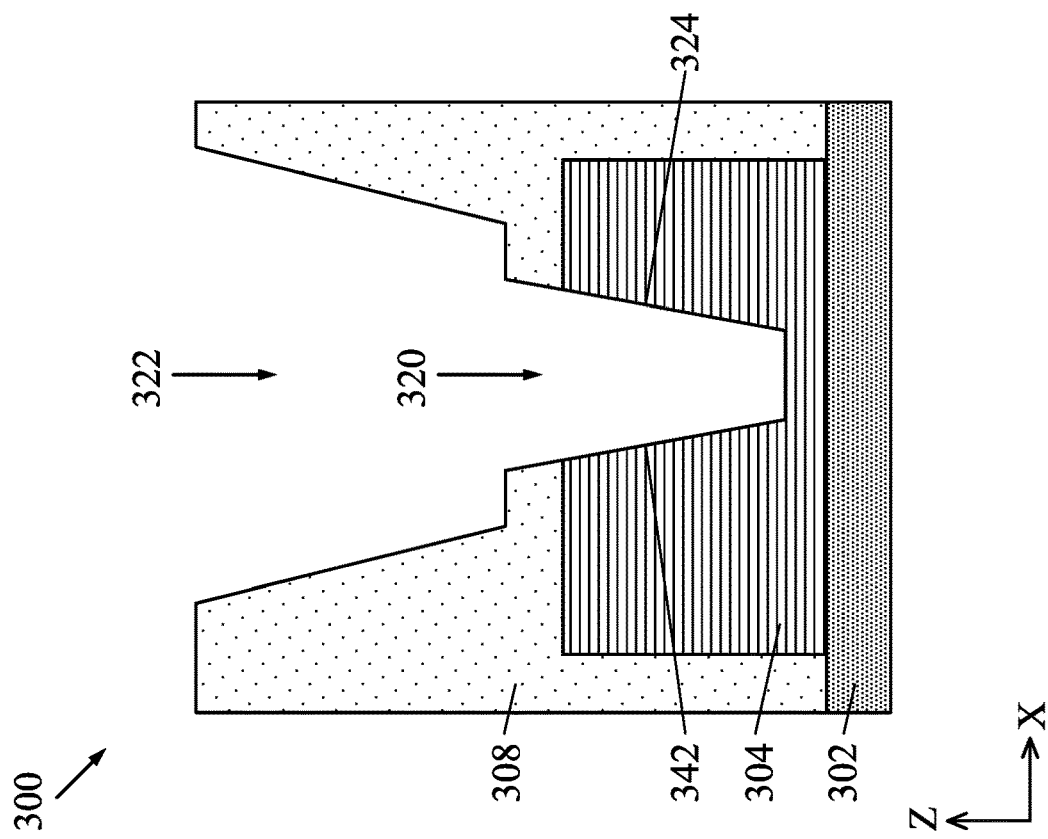
FIGS. 7A-7C are cross-sectional side views of various stages of manufacturing the interconnection structure, in accordance with alternative embodiments.
Figure 7A:
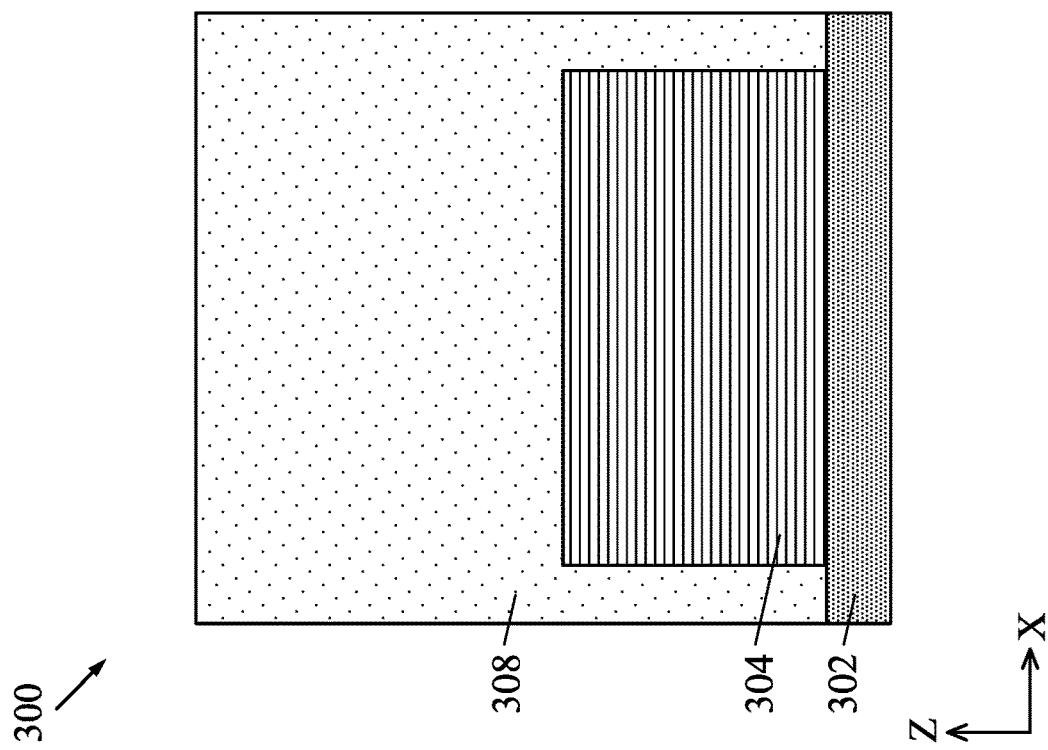
Figure 7C:
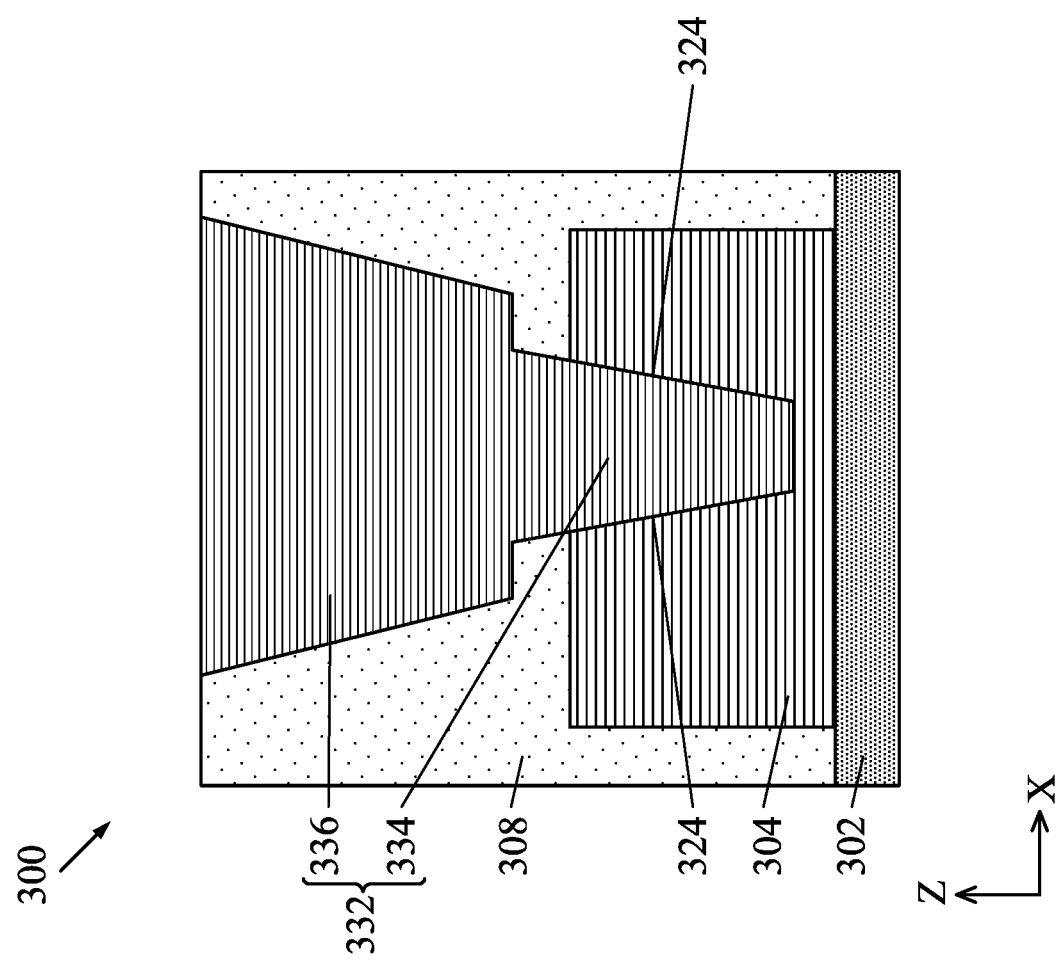

FIGS. 7A-7C are cross-sectional side views of various stages of manufacturing the interconnection structure 300, in accordance with alternative embodiments. As shown in FIG. 7A, the openings are formed in the 2D material layer 304, and the dielectric material 308 is formed in the openings and over the 2D material layer 304. The interconnection structure 300 shown in FIG. 7A may be at the same manufacturing stage as the interconnection structure 300 shown in FIG. 2C.

As shown in FIG. 7B, the first opening 320 is formed in the portion of the 2D material layer 304 and in a portion of the dielectric material 308. The second opening 322 is formed in a portion of the dielectric material 308 over the first opening 320. The side surfaces 324 of the portion of the 2D material layer 304 are exposed in the first opening 320. The interconnection structure 300 shown in FIG. 7B may be at the same manufacturing stage as the interconnection structure 300 shown in FIG. 3B.

As shown in FIG. 7C, a conductive feature 332 is formed in the first and second openings 320, 322. The conductive feature 332 may include the same material as the 2D material layer 304. In some embodiments, the conductive feature 332 includes a different 2D material than the 2D material layer 304. The conductive feature 332 includes a first portion 334 and a second portion 336. In some embodiments, the first portion 334 of the conductive feature 332 may be a conductive via, and the second portion 336 of the conductive feature 332 may be a conductive line. The conductive feature 332 may be formed by a dual damascene process. The first portion 334 of the conductive feature 332 may be formed in the portion of the 2D material layer 304, and the second portion 336 of the conductive feature 332 may be formed in the dielectric material 308. The side surfaces 324 of the portion of the 2D material layer 304 are in contact with the first portion 334 of the conductive feature 332, and the contact resistance may be further reduced due to excellent electrical conduction of the 2D material in the in-plane direction compared to the through-plane direction.

Barrier layers are not needed between the conductive feature 332 and the dielectric material 308, because the conductive feature 332 includes a 2D material. As shown in FIG. 7C, the portion of the dielectric material 308 formed in the openings may be continuously extending from the level of a bottom of the portion of the 2D material layer 304 to the level of a top of the conductive feature 332.

Figure 8B:
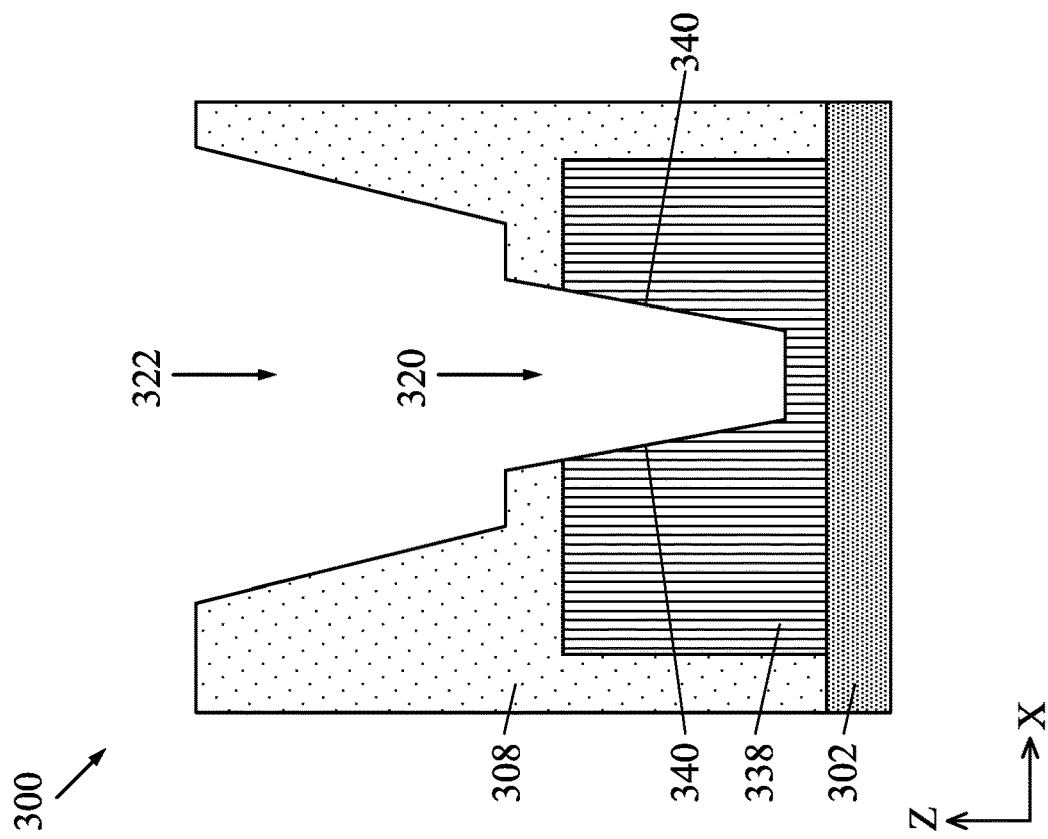
FIGS. 8A-8C are cross-sectional side views of various stages of manufacturing the interconnection structure, in accordance with alternative embodiments.
Figure 8A:
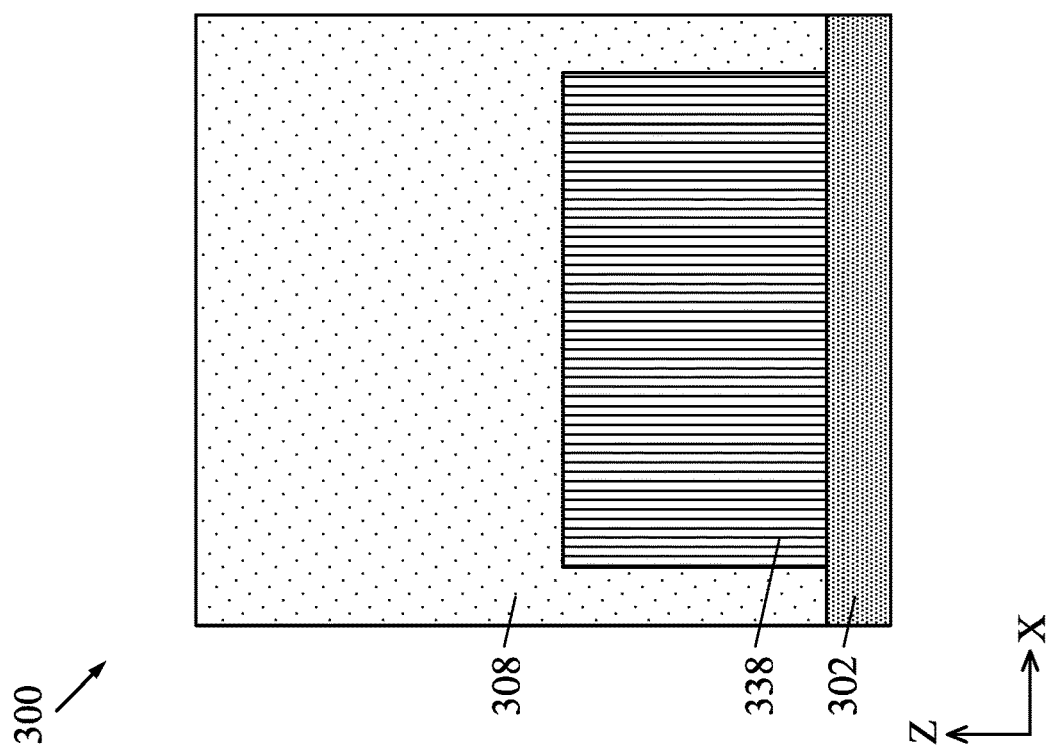
Figure 8C:
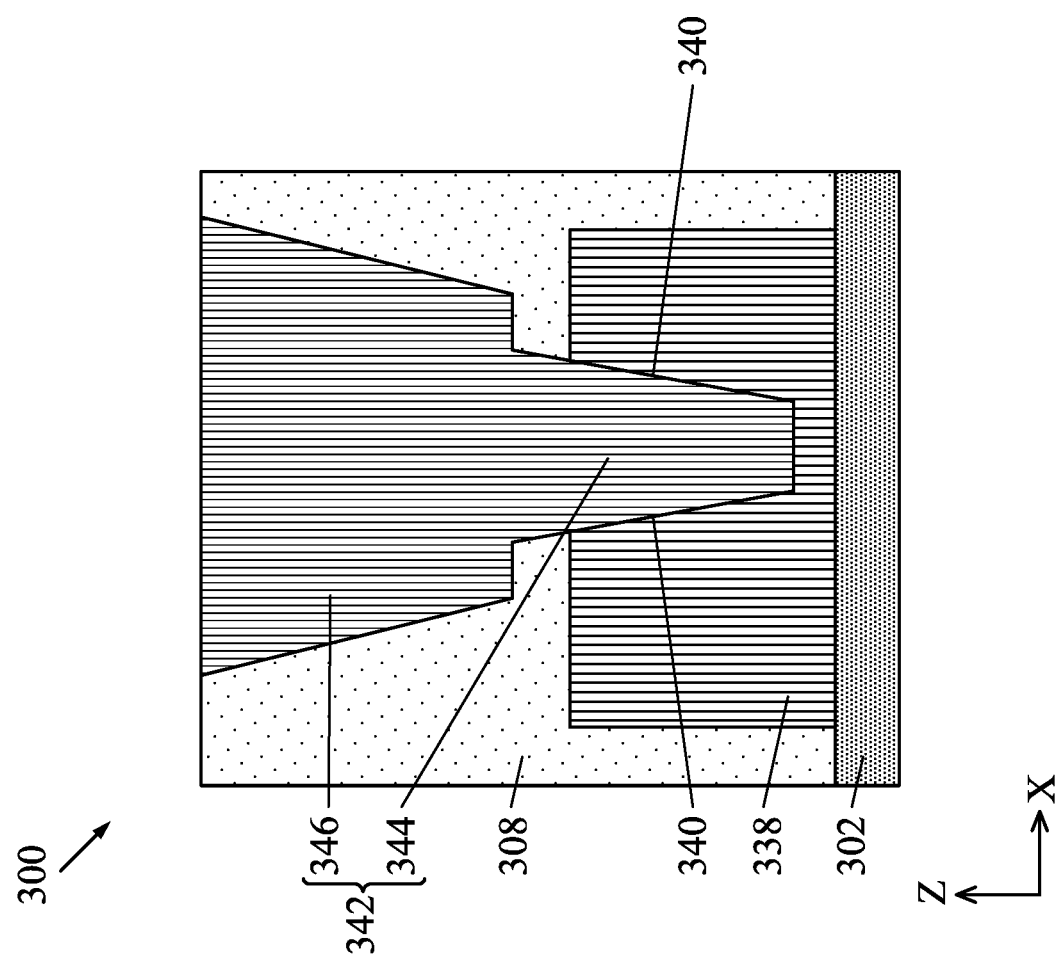

FIGS. 8A-8C are cross-sectional side views of various stages of manufacturing the interconnection structure 300, in accordance with alternative embodiments. As shown in FIG. 8A, a 2D material layer 338 is formed over the dielectric layer 302, openings are formed in the 2D material layer 338, and the dielectric material 308 is formed in the openings and over the 2D material layer 338. The 2D material layer 338 may include the same material as the 2D material layer 304. Each layer of the 2D material of the 2D material layer 304 may be grown horizontally from the dielectric layer 302, as shown in FIG. 2A. As shown in FIG. 8A, however, each layer of the 2D material of the 2D material layer 338 may be grown vertically from the dielectric layer 302. In some embodiments, the 2D material layer 338 includes 15 to 150 layers of graphene and has a total width (along the X-axis) ranging from about 5 nm to about 50 nm. The thickness (along the Z-axis) of the 2D material layer 338 may be the height of the layers of the 2D material. In some embodiments, thickness of the 2D material layer 338 is the same as the thickness of the 2D material layer 304. The 2D material layer 338 may be formed by CVD, PECVD, ALD, transfer techniques, or other suitable process. For example, a PECVD process may be used to form the 2D material layer 338, and the plasma power may be higher than the plasma power of a PECVD process used to form the 2D material layer 304. A portion of the 2D material layer 338 may be referred to as a conductive feature, and one conductive feature is shown in FIG. 8A. Multiple conductive features may be formed on the dielectric layer 302. The top surface of the dielectric material 308 may be substantially flat, as a result of the planarization process.

As shown in FIG. 8B, the first opening 320 is formed in the portion of the 2D material layer 338 and in a portion of the dielectric material 308. The second opening 322 is formed in a portion of the dielectric material 308 over the first opening 320. The side surfaces 340 of the portion of the 2D material layer 338 are exposed in the first opening 320.

As shown in FIG. 8C, a conductive feature 342 is formed in the first and second openings 320, 322. The conductive feature 342 may include the same material as the 2D material layer 338. In some embodiments, the conductive feature 342 includes a different 2D material than the 2D material layer 338. Compared to the conductive feature 332 shown in FIG. 7C, which includes a plurality of layers of 2D material formed horizontally, the conductive feature 342 includes a plurality of layers of 2D material formed vertically. The conductive feature 342 includes a first portion 344 and a second portion 346. In some embodiments, the first portion 344 of the conductive feature 342 may be a conductive via, and the second portion 346 of the conductive feature 342 may be a conductive line. The conductive feature 342 may be formed by a dual damascene process. The first portion 344 of the conductive feature 342 may be formed in the portion of the 2D material layer 338, and the second portion 346 of the conductive feature 342 may be formed in the dielectric material 308. The side surfaces 340 of the portion of the 2D material layer 338 are in contact with the first portion 344 of the conductive feature 342, and the contact resistance may be further reduced due to excellent electrical conduction of the 2D material in the in-plane direction compared to the through-plane direction. Barrier layers are not needed between the conductive feature 342 and the dielectric material 308, because the conductive feature 342 includes a 2D material. As shown in FIG. 2D, the portion of the dielectric material 308 formed in the openings may be continuously extending from the level of a bottom of the portion of the 2D material layer 338 to the level of a top of the conductive feature 342. In some embodiments, the conductive feature 310 or 332 is formed in the first and second openings 320, 322. In some embodiments, the conductive feature 342 is formed instead of the conductive feature 310 or 332 in previously described embodiments.

Figure 9B:
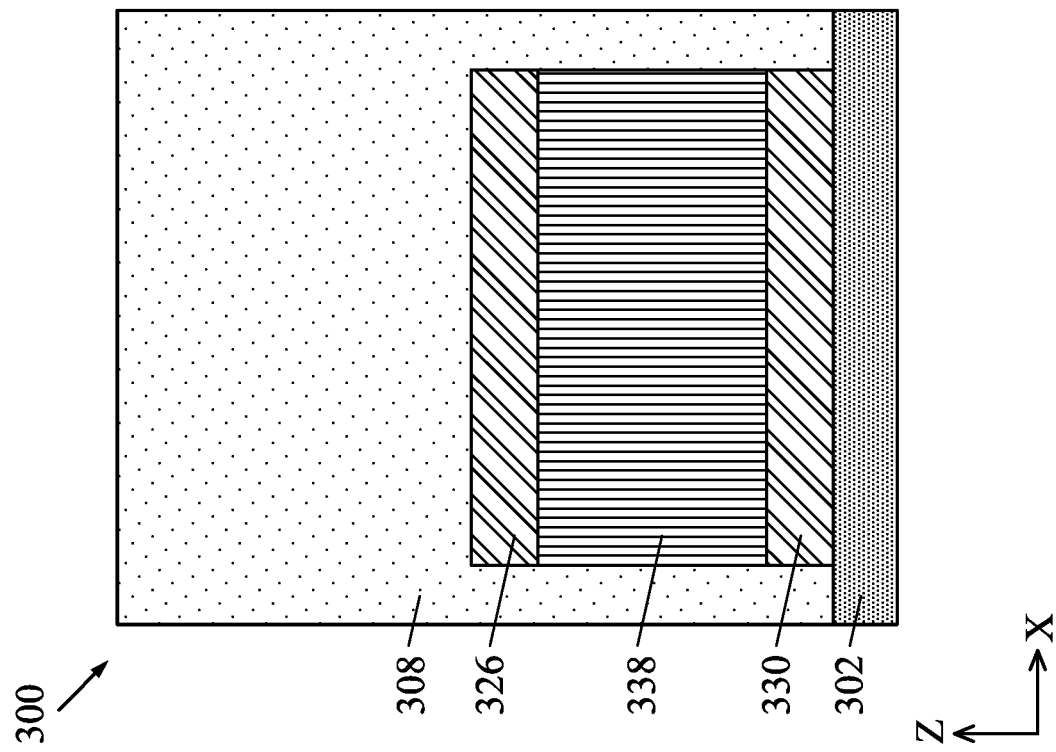
FIGS. 9A-9D are cross-sectional side views of various stages of manufacturing the interconnection structure, in accordance with alternative embodiments.
Figure 9A:
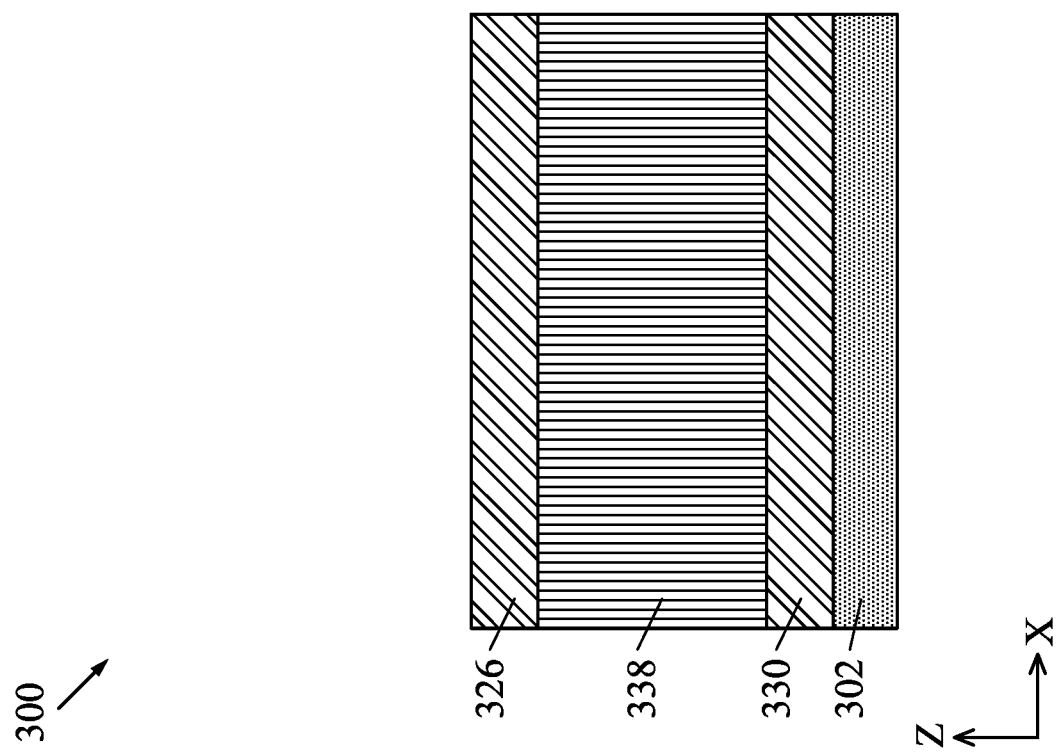

FIGS. 9A-9D are cross-sectional side views of various stages of manufacturing the interconnection structure 300, in accordance with alternative embodiments. As shown in FIG. 9A, the conductive layer 330 is formed on the dielectric layer 302, the 2D material layer 338 is formed on the conductive layer 330, and the conductive layer 326 is formed on the 2D material layer 338. In some embodiments, the conductive layer 330 may be omitted. As shown in FIG. 9B, the openings are formed in the conductive layer 330, the 2D material layer 338, and the conductive layer 326, and the dielectric material 308 is formed in the openings and over the conductive layer 326. A portion of the conductive layer 326, a portion of the 2D material layer 338, and a portion of the conductive layer 330 together may be referred to as a conductive feature, and one conductive feature is shown in FIG. 9B. Multiple conductive features may be formed on the dielectric layer 302. The top surface of the dielectric material 308 may be substantially flat, as a result of the planarization process. In some embodiments, the conductive layer 326 and the conductive layer 330 include a metal that is not susceptible to diffusion, thus, there are no barrier layers formed between the conductive layers 326, 330 and the dielectric material 308. In some embodiments, the conductive layer 326 and the conductive layer 330 include a metal that is susceptible to diffusion, and the barrier layer 328 (FIG. 9D) is formed between each portion of the conductive layer 326 and the dielectric material 308 and between each portion of the conductive layer 330 and the dielectric material 308.

Figure 9D:
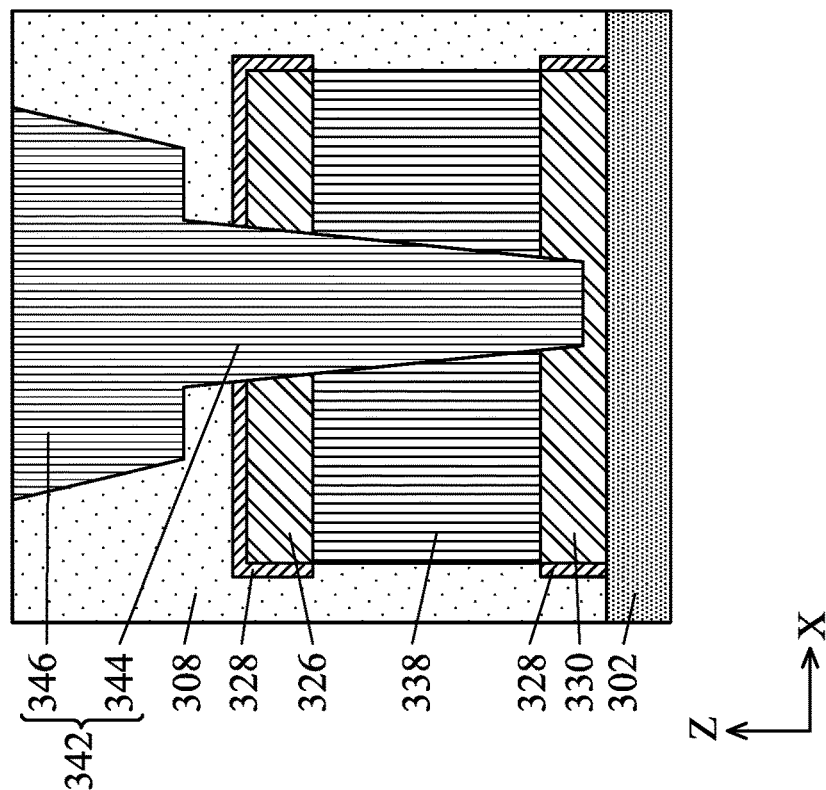
Figure 9C:
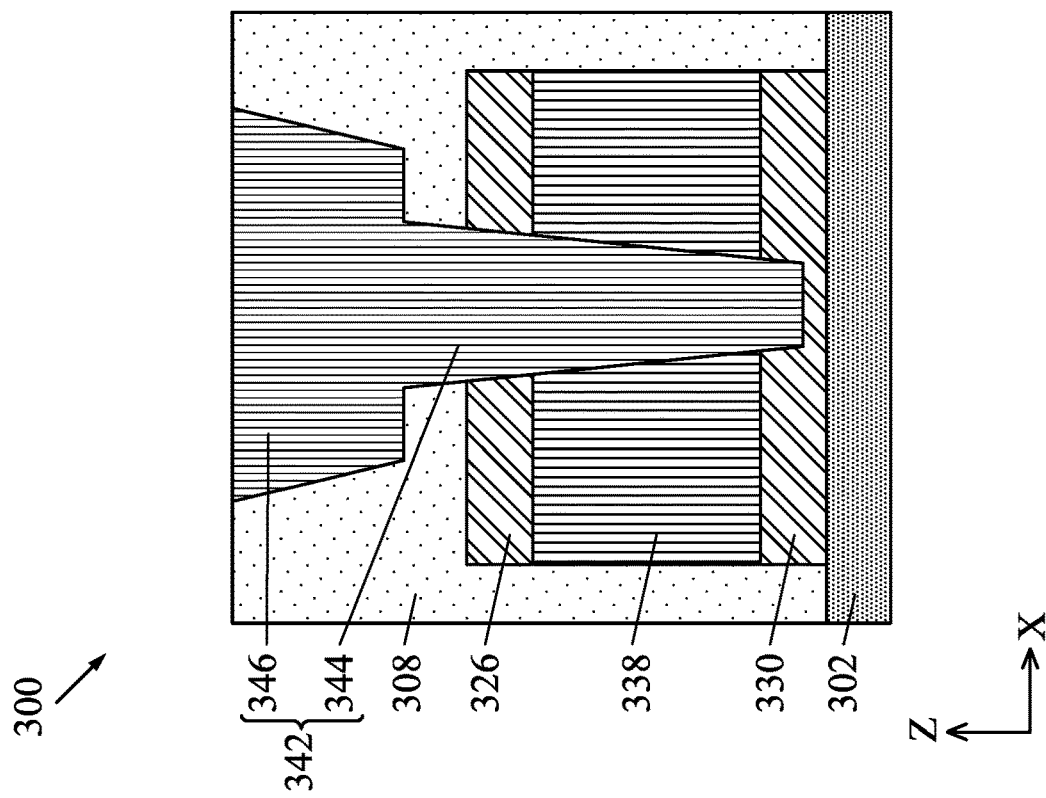

As shown in FIG. 9C, the conductive feature 342 is formed in the dielectric material 308, a portion of the conductive layer 326, a portion of the 2D material layer 338, and a portion of the conductive layer 330. For example, the first portion 344 of the conductive feature 342 may be formed through the portion of the conductive layer 326, the portion of the 2D material layer 338, and in the portion of the conductive layer 330. In some embodiments, the conductive layer 330 is omitted, and the first portion 344 of the conductive feature 342 may be formed in the portion of the conductive layer 326 or through the portion of the conductive layer 326 and in the portion of the 2D material layer 338. In some embodiments, the first portion 344 of the conductive feature 342 may have a bottom surface that is in contact with the portion of the conductive layer 330, as shown in FIG. 9C. The electric current may be conducted through both metal-to-2D material and metal-to-metal, which may further reduce contact resistance. As shown in FIG. 9C, the portion of the dielectric material 308 formed in the openings may be continuously extending from the level of a bottom of the portion of the conductive layer 330 to the level of a top of the conductive feature 342.

As shown in FIG. 9D, which is an alternative embodiment as the interconnection structure 300 shown in FIG. 9C, the conductive layers 326, 330 include a metal that is susceptible to diffusion, and the barrier layers 328 is formed between the portion of the conductive layer 330 and the dielectric material 308 and between the portion of the conductive layer 326 and the dielectric material 308. The barrier layers 328 may be formed after forming the openings in the conductive layers 326, 330 and the 2D material layer 338, and the barrier layers 328 may be formed by any suitable selective deposition process. The 2D material layer 304 and the conductive feature 332 may replace the 2D material layer 338 and the conductive feature 342, respectively, in FIGS. 9C and 9D.

The present disclosure in various embodiments provides using a 2D material as conductive features in BEOL. The Some embodiments may achieve advantages. For example, a portion of the 2D material layer 304 or 338 having a width from about 5 nm to about 50 nm has reduced contact resistance and sheet resistance compared to the metal conductive feature having the similar dimension. In addition, the 2D material is not susceptible to diffusion. Thus, barrier layers are not needed between the 2D material layer 304 or 338 and the dielectric material 308, leading to further reduced contact resistance. Lastly, portions of the metallic conductive layer 326 and/or conductive layer 330 may be part of the conductive feature along with the 2D material layer 304 or 338, which may further reduce contact resistance due to both metal-to-2d material and metal-to-metal electrical conduction.

An embodiment is an interconnection structure. The structure includes a first conductive feature having a two-dimensional material layer, a second conductive feature disposed over the first conductive feature, and a dielectric material disposed adjacent the first and second conductive features. The dielectric material extends from a level of a bottom of the first conductive feature to a level of a top of the second conductive feature.

Another embodiment is a structure. The structure includes a first conductive feature having a first two-dimensional material layer and a second conductive feature. A portion of the second conductive feature is disposed in the first conductive feature. The structure further includes a dielectric material disposed adjacent the first and second conductive features. The dielectric material extends from a level of a bottom of the first conductive feature to a level of a top of the second conductive feature.

A further embodiment is a structure. The structure includes a first conductive feature having a first conductive layer and a first two-dimensional material layer disposed on the first conductive layer. The structure further includes a second conductive feature, and a portion of the second conductive feature is disposed through the first two-dimensional material layer and in the first conductive layer. The structure further includes a dielectric material disposed adjacent the first and second conductive features. The dielectric material extends from a level of a bottom of the first conductive layer to a level of a top of the second conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. An interconnection structure, comprising:
a first conductive feature comprising a two-dimensional material layer, a first conductive layer disposed on the two-dimensional material layer, and a second conductive layer, wherein the two-dimensional material layer is disposed on the second conductive layer;
a second conductive feature disposed over the first conductive feature and through the first conductive layer, the two-dimensional material layer, and in the second conductive layer; and
a dielectric material disposed adjacent the first and second conductive features.

2. The interconnection structure of claim 1, wherein the two-dimensional material layer comprises graphene, hexagonal-BN, or transition metal dichalcogenide.

3. The interconnection structure of claim 2, wherein the second conductive feature comprises a metal.

4. The interconnection structure of claim 3, wherein the dielectric material is in contact with the second conductive feature.

5. The interconnection structure of claim 3, further comprising a barrier layer disposed between the second conductive feature and the dielectric material.

6. The interconnection structure of claim 5, wherein the barrier layer is disposed between the first conductive feature and the second conductive feature.

7. The interconnection structure of claim 1, wherein the first and second conductive layers comprise a same material.

8. The interconnection structure of claim 1, wherein the second conductive feature comprises a first portion and a second portion disposed over the first portion, wherein the second portion has larger dimensions than the first portion.

9. The interconnection structure of claim 8, wherein the first portion of the second conductive feature is disposed through the first conductive layer, the two-dimensional material layer, and in the second conductive layer, and the second portion of the second conductive feature is disposed over the first conductive feature.

10. An interconnection structure, comprising:
a first conductive feature comprising a first two-dimensional material layer formed horizontally;
a second conductive feature comprising a second two-dimensional material layer formed horizontally, wherein a portion of the second conductive feature is disposed in the first conductive feature; and
a dielectric material disposed adjacent the first and second conductive features.

11. The interconnection structure of claim 10, wherein the first two-dimensional material layer comprises a plurality of graphene layers, a plurality of hexagonal-BN layers, or a plurality of transition metal dichalcogenide layers.

12. The interconnection structure of claim 10, wherein first conductive feature further comprises a first conductive layer and a second conductive layer, wherein the first two-dimensional material layer is disposed between the first and second conductive layers.

13. The interconnection structure of claim 12, further comprising a first barrier layer disposed between the second conductive layer and the dielectric material.

14. The interconnection structure of claim 13, further comprising a second barrier layer disposed between the first conductive layer and the dielectric material.

15. An interconnection structure, comprising:
- a first conductive feature, comprising:
  - a first conductive layer; and
  - a first two-dimensional material layer disposed on the first conductive layer;
- a second conductive feature, wherein a portion of the second conductive feature is disposed through the first two-dimensional material layer and in the first conductive layer; and
- a dielectric material disposed adjacent the first and second conductive features, wherein the dielectric material extends from a level of a bottom of the first conductive layer to a level of a top of the second conductive feature.

16. The interconnection structure of claim 15, wherein the first conductive feature further comprises a second conductive layer disposed on the first two-dimensional material layer.

17. The interconnection structure of claim 16, wherein the second conductive feature is disposed through the second conductive layer.

18. The interconnection structure of claim 17, wherein the second conductive feature comprises a metal.

19. The interconnection structure of claim 18, further comprising a barrier layer disposed between the second conductive feature and the dielectric material.

20. The interconnection structure of claim 17, wherein the second conductive feature comprises a second two-dimensional material layer.

* * * * *